United States Patent
Tashiro

(10) Patent No.: US 10,368,016 B2
(45) Date of Patent: Jul. 30, 2019

(54) PHOTOELECTRIC CONVERSION DEVICE AND IMAGING SYSTEM

(71) Applicant: CANON KABUSHIKI KAISHA, Tokyo (JP)

(72) Inventor: Kazuaki Tashiro, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/821,503

(22) Filed: Nov. 22, 2017

(65) Prior Publication Data

US 2018/0152652 A1    May 31, 2018

(30) Foreign Application Priority Data

Nov. 30, 2016 (JP) ................................. 2016-233212

(51) Int. Cl.
| | |
|---|---|
| H04N 5/353 | (2011.01) |
| H01L 27/146 | (2006.01) |
| H04N 5/378 | (2011.01) |
| H01L 31/02 | (2006.01) |
| H01L 31/0352 | (2006.01) |
| H01L 31/0224 | (2006.01) |

(52) U.S. Cl.
CPC ....... *H04N 5/3532* (2013.01); *H01L 27/1461* (2013.01); *H01L 27/14636* (2013.01); *H01L 31/035272* (2013.01); *H04N 5/378* (2013.01); *H01L 31/022408* (2013.01); *H01L 31/022475* (2013.01)

(58) Field of Classification Search
CPC .. H04N 5/3532; H04N 5/378; H01L 27/1461; H01L 27/14636; H01L 31/035272
See application file for complete search history.

(56) References Cited

U.S. PATENT DOCUMENTS

| | | | | |
|---|---|---|---|---|
| 5,739,851 A * | 4/1998 | Ohsawa | ............ | H01L 27/14806 348/248 |
| 2001/0015404 A1* | 8/2001 | Takada | .................... | H04N 3/155 250/208.1 |
| 2012/0200752 A1* | 8/2012 | Matsunaga | ....... | H01L 27/14609 348/300 |
| 2013/0313410 A1* | 11/2013 | Goto | .................... | H04N 5/3698 250/208.1 |
| 2013/0320309 A1* | 12/2013 | Kim | ...................... | H01L 51/441 257/40 |
| 2014/0313383 A1* | 10/2014 | Lee | .................... | H04N 5/35509 348/302 |
| 2015/0146056 A1* | 5/2015 | Hirota | .................. | H04N 5/2258 348/294 |

(Continued)

FOREIGN PATENT DOCUMENTS

| | | |
|---|---|---|
| JP | 8-139303 A | 5/1996 |
| JP | 2014-82293 A | 5/2014 |

*Primary Examiner* — Abdelaaziz Tissire
(74) *Attorney, Agent, or Firm* — Canon U.S.A., Inc. IP Division

(57) ABSTRACT

A photoelectric conversion device includes a voltage supply portion configured to set a bias state of a photoelectric conversion layer to each of a reverse bias state and a forward bias state by supplying a plurality of voltages having respective different values to at least one of a first electrode portion and a second electrode portion, wherein, during the forward bias state, a current flows between the first electrode portion and the second electrode portion.

37 Claims, 15 Drawing Sheets

(56) References Cited

U.S. PATENT DOCUMENTS

| | | | |
|---|---|---|---|
| 2015/0172556 A1* | 6/2015 | Yonemura | H04N 5/243 348/297 |
| 2016/0013328 A1* | 1/2016 | Tashiro | H01L 31/0232 250/208.1 |
| 2016/0014364 A1* | 1/2016 | Tashiro | H04N 5/3741 348/300 |
| 2016/0035920 A1* | 2/2016 | Tashiro | H04N 5/3575 250/208.1 |
| 2016/0360131 A1* | 12/2016 | Shimasaki | H04N 5/363 |
| 2017/0154908 A1* | 6/2017 | Tashiro | H04N 5/3745 |
| 2017/0180657 A1* | 6/2017 | Tashiro | H04N 5/3575 |
| 2017/0272662 A1* | 9/2017 | Tamaki | H04N 5/33 |
| 2018/0151608 A1* | 5/2018 | Tashiro | H01L 27/1461 |
| 2018/0151620 A1* | 5/2018 | Tashiro | H04N 5/374 |
| 2018/0151760 A1* | 5/2018 | Tashiro | H01L 31/022425 |
| 2018/0184017 A1* | 6/2018 | Tashiro | H04N 5/353 |
| 2018/0227526 A1* | 8/2018 | Tokuhara | H01L 27/146 |

\* cited by examiner

PHOTOELECTRIC CONVERSION MODE (ACCUMULATION OF SIGNAL ELECTRIC CHARGE)

MODE B (ELECTRONIC SHUTTER)

MODE A (RESETTING OF FIRST ELECTRIC CHARGE ACCUMULATION PORTION)

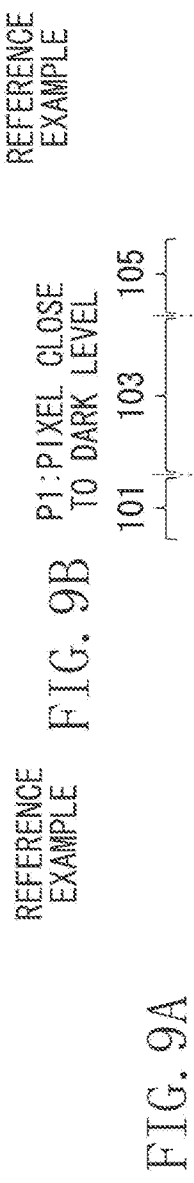
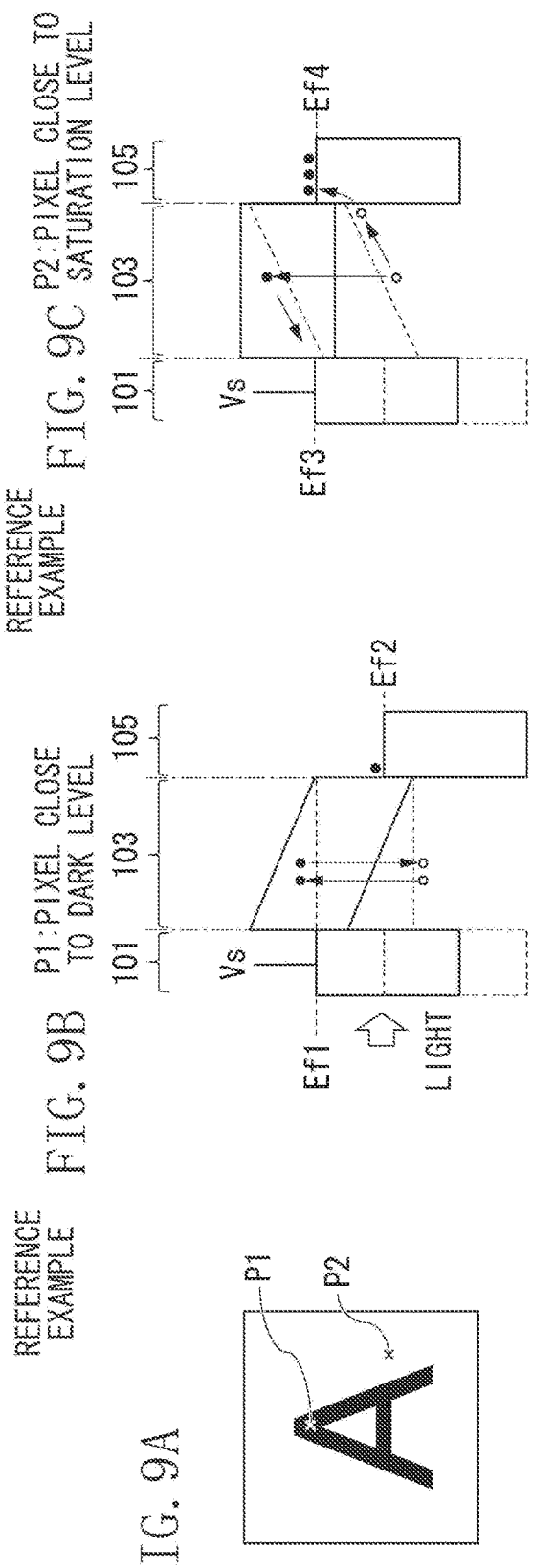
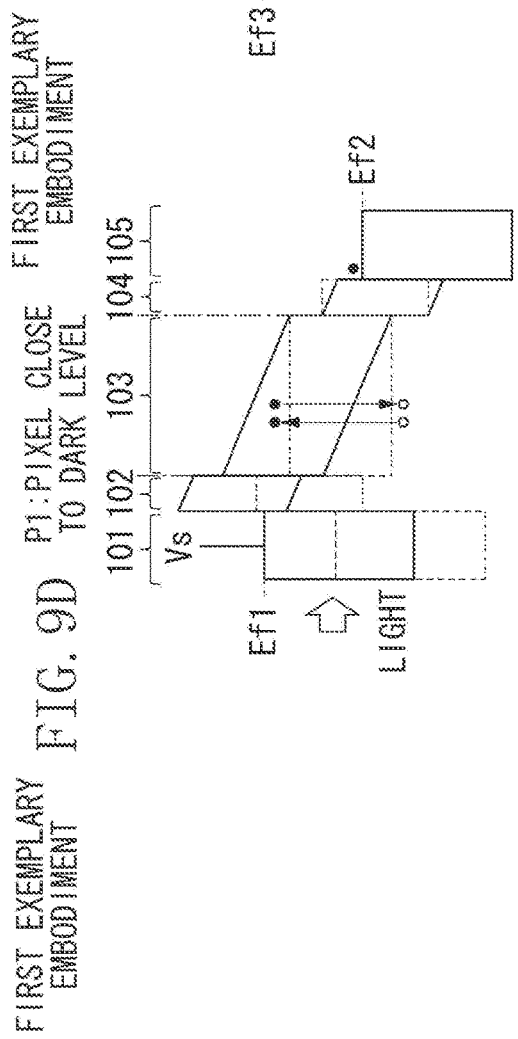
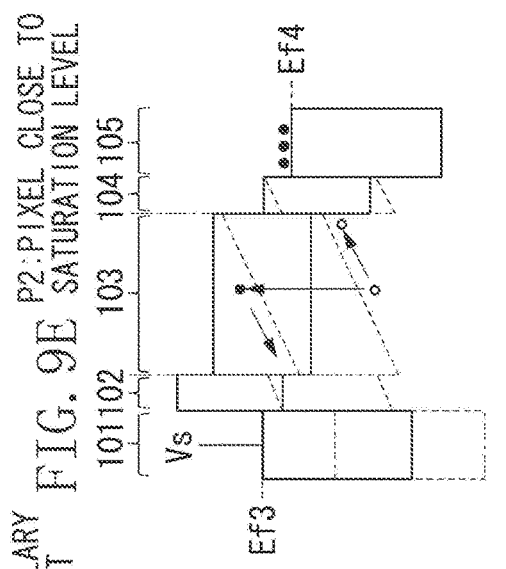

PHOTOELECTRIC CONVERSION MODE

MODE A

PHOTOELECTRIC CONVERSION DEVICE AND IMAGING SYSTEM

BACKGROUND OF THE INVENTION

Field of the Invention

Aspects of the embodiments generally relate to a photoelectric conversion device and an imaging system.

Description of the Related Art

As a photoelectric conversion device, for example, used for an image sensor of a camera, there is proposed what is called a stack type photoelectric conversion device, in which a photoelectric conversion layer is stacked above a semiconductor substrate.

Japanese Patent Application Laid-Open No. 2014-82293 discusses such a stack type photoelectric conversion device. In the photoelectric conversion device, an upper electrode shared by a plurality of pixels is located on the photoelectric conversion layer, and a pixel electrode is located under the photoelectric conversion layer. According to the discussion in Japanese Patent Application Laid-Open No. 2014-82293, resetting of a first electric charge accumulation portion is performed using a reset transistor.

SUMMARY OF THE INVENTION

According to an aspect of the embodiments, a photoelectric conversion device includes a semiconductor substrate and a pixel, wherein the pixel includes a first electrode portion, a second electrode portion located between the first electrode portion and the semiconductor substrate, a photoelectric conversion layer located between the first electrode portion and the second electrode portion and configured to generate signal electric charge, and a voltage supply portion configured to set a reverse bias state and a forward bias state of the photoelectric conversion layer by supplying a plurality of voltages having respective different values to at least one of the first electrode portion and the second electrode portion, wherein the signal electric charge accumulated in the second electrode portion is reset by setting the photoelectric conversion layer to the forward bias state.

Further features of the disclosure will become apparent from the following description of exemplary embodiments with reference to the attached drawings.

BRIEF DESCRIPTION OF THE DRAWINGS

FIGS. 9A, 9B, 9C, 9D, and 9E illustrate energy band states corresponding to the luminance of an object and an operation of the photoelectric conversion portion.

DESCRIPTION OF THE EMBODIMENTS

With regard to the photoelectric conversion device discussed in Japanese Patent Application Laid-Open No. 2014-82293, studying of the optimization of a bias state of the photoelectric conversion layer is insufficient. Aspects of the embodiments are generally directed to providing a technique capable of optimizing a bias state of the photoelectric conversion layer.

According to one exemplary embodiment, a photoelectric conversion device is provided. The photoelectric conversion device includes a semiconductor substrate and a photoelectric conversion layer stacked on the semiconductor substrate. The photoelectric conversion layer is configured to photoelectrically convert light incident on the photoelectric conversion layer into electric charge. Furthermore, the photoelectric conversion layer does not need to have a photoelectric conversion function in whole. The semiconductor substrate is provided with a circuit portion configured to receive a signal which is based on signal electric charge generated in the photoelectric conversion layer. In some exemplary embodiments, the photoelectric conversion device includes a plurality of pixels. In these exemplary embodiments, a plurality of circuit portions is arranged in association with the plurality of pixels. Each of the plurality of circuit portions can include an amplifying portion, which amplifies a signal, and an analog-to-digital (AD) conversion portion, which converts a signal into a digital signal.

Figure 3A:
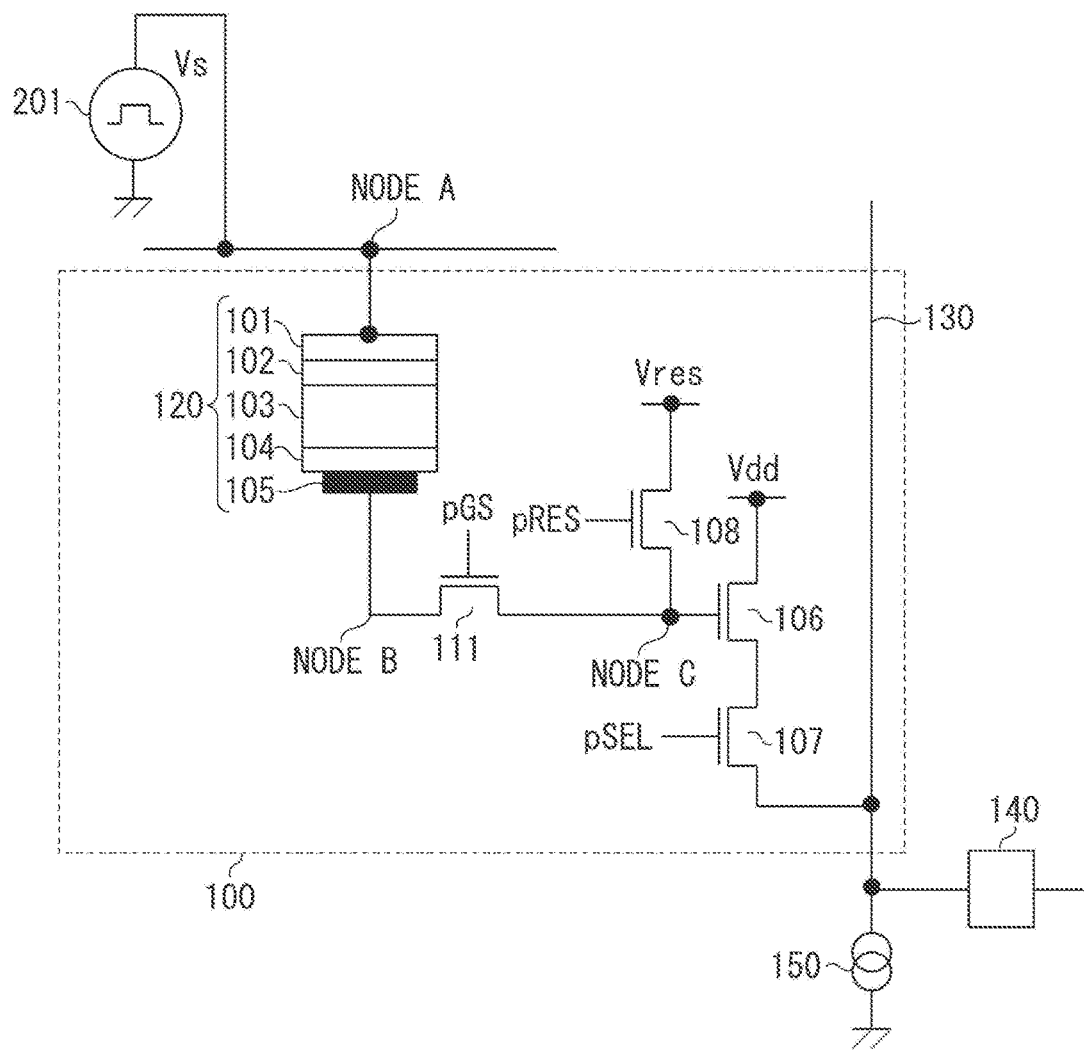
FIGS. 3A and 3B illustrate a circuit configuration of a pixel.

One exemplary embodiment is described with reference to FIG. 3A. Furthermore, FIG. 3A is also described in detail in an exemplary embodiment described below. With regard to a pixel 100, as illustrated in FIG. 3A, a photoelectric conversion portion 120 in the present exemplary embodiment includes a first blocking layer 104 between a pixel electrode 105 and a photoelectric conversion layer 103. Moreover, as illustrated in FIG. 3A, the photoelectric conversion portion 120 includes an upper electrode 101 and a second blocking layer 102 located between the upper electrode 101 and the photoelectric conversion layer 103. The photoelectric conversion portion 120 forms a photodiode with the upper electrode 101, the second blocking layer 102, the photoelectric conversion layer 103, the first blocking layer 104, and the pixel electrode 105. Signal electric charge in a node B, which serves as a first electric charge accumulation portion, is reset by the upper electrode 101 and the pixel electrode 105 applying a bias in a forward direction to the photoelectric conversion portion 120, which has a diode characteristic. Moreover, a photoelectric conversion operation, in which the photoelectric conversion layer 103 injects signal electric charge into the node B, is performed by the upper electrode 101 and the pixel electrode 105 applying a bias in a reverse direction to the photoelectric conversion portion 120, which has a diode characteristic.

Various exemplary embodiments, features, and aspects of the disclosure will be described in detail below with reference to the drawings. The disclosure is not limited to only the exemplary embodiments described below. Modification examples in which a configuration of a part of the exemplary embodiments described below is modified or altered within a range not exceeding the gist of the disclosure are also exemplary embodiments of the disclosure. Moreover, an example in which a configuration of a part of any exemplary embodiment described below is added to another exemplary embodiment or an example in which a configuration of a part of any exemplary embodiment described below is replaced by a configuration of a part of another exemplary embodiment is also an exemplary embodiment of the disclosure.

<Configuration of Photoelectric Conversion Device>

Figure 1:
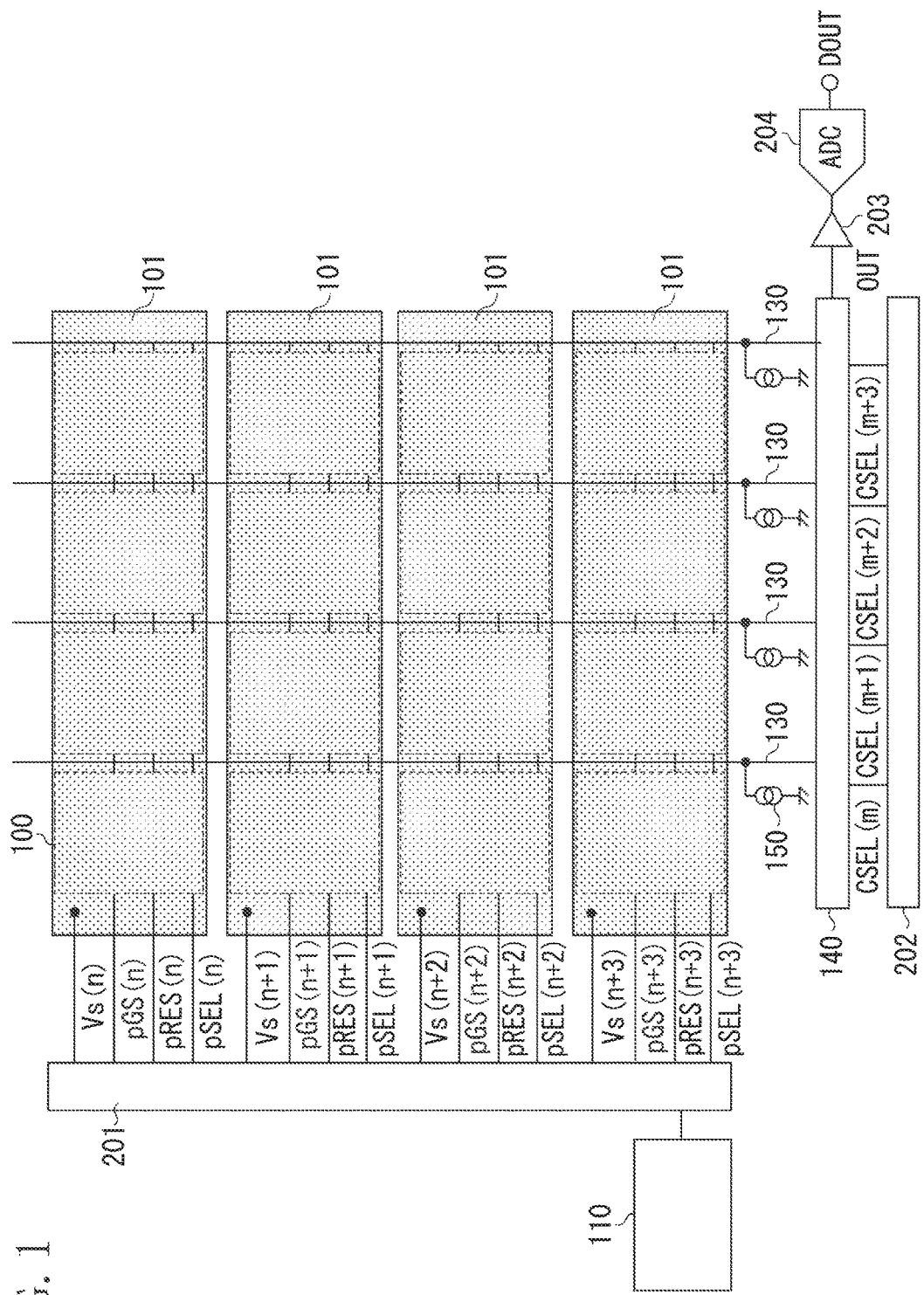
FIG. 1 illustrates a configuration of a photoelectric conversion device.

FIG. 1 illustrates a circuit configuration of the entirety of a photoelectric conversion device according to a first exemplary embodiment and an arrangement layout of the upper electrodes 101 in combination.

In FIG. 1, 16 pixels 100 which are arranged as a matrix with 4 rows and 4 columns are illustrated. While, in the first exemplary embodiment, a matrix with 4 rows and 4 columns is described, the number of rows and the number of columns are not limited to these. A plurality of pixels 100 included in one column is connected to one output line 130. One current source 150 is connected to one output line 130. The current source 150 supplies current to the pixel 100. The pixel 100 outputs a pixel signal to the output line 130. The pixel signal includes a photo signal, which is a signal generated based on incident light, and a noise signal, which mainly contains a nose component of the pixel 100.

The photoelectric conversion device further includes a reference voltage supply portion 110 and a row drive circuit 201. The reference voltage supply portion 110 supplies a reference voltage used to generate voltages Vs which the row drive circuit 201 supplies. The row drive circuit 201 supplies an electrode drive voltage Vs, a reset signal pRES, a drive signal pSEL, and a drive signal pGS. A plurality of pixels 100 included in one row is connected to a common reset signal line, a common first drive signal line, and a common second drive signal line. The reset signal line is a wiring line used to transmit the reset signal pRES. The first drive signal line is a wiring line used to transmit the drive signal pSEL. The second drive signal line is a wiring line used to transmit the drive signal pGS. Furthermore, in FIG. 1, to differentiate drive signals to be supplied to different rows, reference characters indicating rows, such as (n) and (n+1), are appended to the respective ends of the signal names. This also applies to the other figures.

FIG. 1 schematically illustrates a planar structure of the upper electrodes 101. One upper electrode 101 is provided in association with the pixels 100 included in one row. In the first exemplary embodiment, the upper electrode 101 is provided for each row. The row drive circuit 201 supplies voltages Vs on a row-by-row basis. The voltages Vs include a first voltage and a second voltage which is different in voltage value from the first voltage. The row drive circuit 201 is a voltage supply portion which supplies a plurality of voltages different in value to the upper electrodes 101. Furthermore, to differentiate voltages Vs to be supplied to different rows, reference characters indicating rows, such as (n) and (n+1), are appended to the voltage name Vs.

The photoelectric conversion device further includes a column circuit 140. While, in FIG. 1, column circuits 140 for a plurality of columns are simply illustrated as one block, actually, one column circuit 140 is configured to be provided for one output line 130.

A column drive circuit 202 supplies drive signals CSEL to a plurality of column circuits 140. The column drive circuit 202 sequentially sets the drive signals CSEL to an active level for each column circuit 140. With this, the column drive circuit 202 drives the column circuits 140 for each column. Furthermore, to differentiate drive signals to be supplied to different columns, reference characters indicating columns, such as (m) and (m+1), are appended to the respective ends of the signal name CSEL. This also applies to the other figures.

The column drive circuit 202 causes respective signals to be output from the plurality of column circuits 140 to an output amplifier portion 203. The output amplifier portion 203 amplifies the input signal and outputs the amplified signal to an AD conversion portion 204. The AD conversion portion 204 converts the input signal into a digital signal and outputs the digital signal as a signal DOUT to outside the photoelectric conversion device.

<Configuration of Column Circuit>

Figure 2:
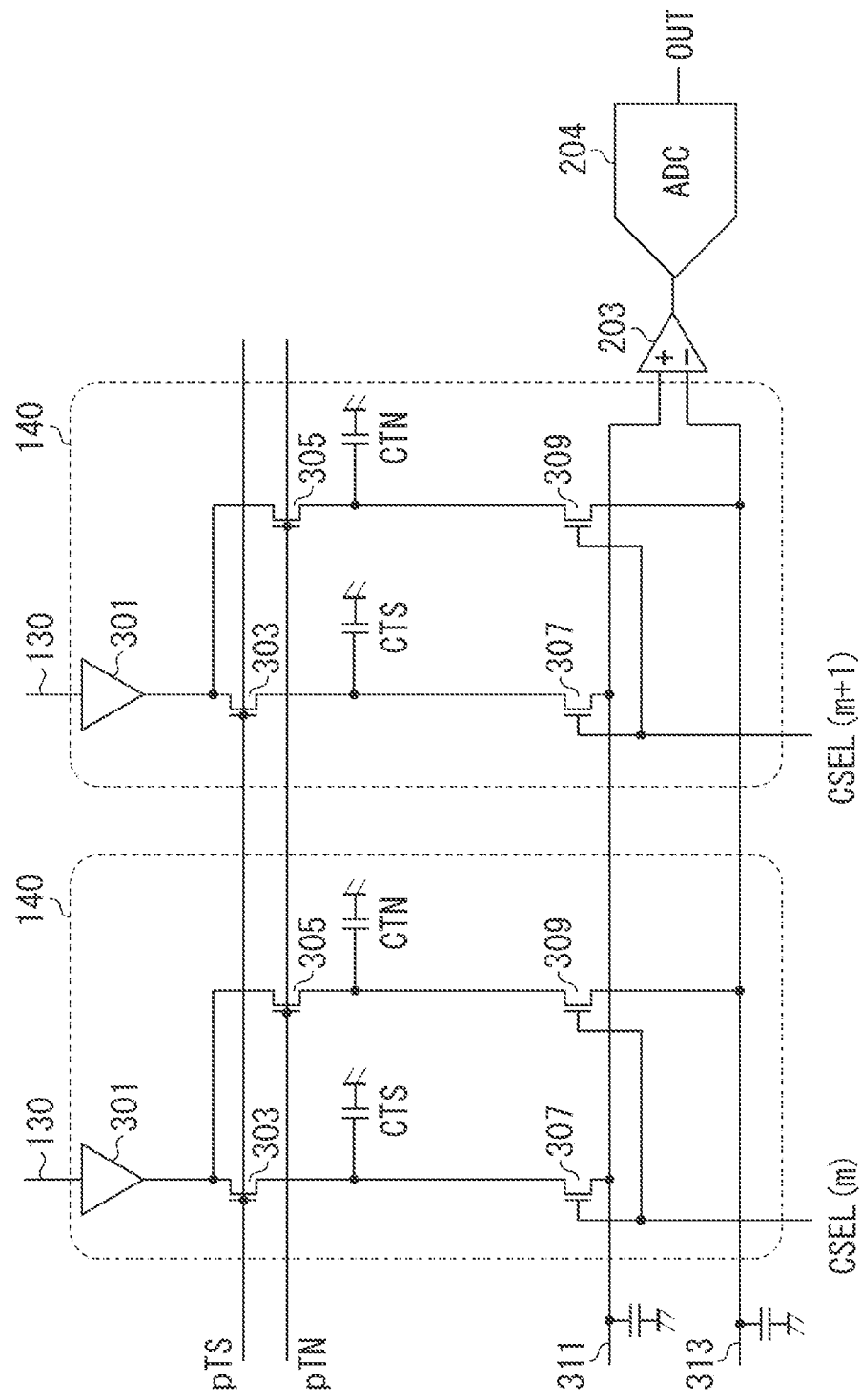
FIG. 2 illustrates a circuit configuration of a column circuit and a subsequent circuit following the column circuit.

FIG. 2 illustrates equivalent circuits of the column circuits 140 in the m-th column and (m+1)-th column. The column circuits 140 illustrated in FIG. 2 correspond to two columns of the column circuit 140 illustrated in FIG. 1.

A pixel signal output to the output line 130 is amplified by a column amplifier 301. The output node of the column amplifier 301 is connected to a capacitance CTS via a sample-and-hold (S/H) switch 303. Moreover, the output node of the column amplifier 301 is connected to a capacitance CTN via an S/H switch 305. The S/H switch 303 and the S/H switch 305 are controlled by a drive signal pTS and a drive signal pTN, respectively, which are output from a timing generator (not illustrated). With this configuration, the capacitance CTN retains a signal which is based on a noise signal output from the pixel 100. Moreover, the capacitance CTS retains a photo signal which contains a noise signal as a part of the component.

The capacitance CTS is connected to a horizontal output line 311 via a horizontal transfer switch 307. The capacitance CTN is connected to a horizontal output line 313 via a horizontal transfer switch 309. The horizontal transfer switches 307 and 309 are controlled by the drive signal CSEL output from the column drive circuit 202.

Each of the horizontal output line 311 and the horizontal output line 313 is connected to the output amplifier portion 203. The output amplifier portion 203 outputs a difference between a signal from the horizontal output line 311 and a signal from the horizontal output line 313 to the AD conversion portion 204. The output amplifier portion 203 obtains a difference between the photo signal and the noise signal. This enables obtaining a signal obtained by subtracting the noise signal included in the photo signal from the photo signal. The AD conversion portion 204 converts a signal output from the output amplifier portion 203 into a digital signal.

Furthermore, in this example, a configuration in which a signal horizontally transferred from the column circuit 140 is AD converted is employed. As another example, the column circuit 140 of each column can be provided with an AD conversion portion. In this case, the AD conversion portion includes a retention unit which retains a digital signal corresponding to a pixel signal, such as a memory or counter. The noise signal and the photo signal are converted into respective digital signals and are then retained in the retention unit.

<Configuration of Pixel>

Figure 3B:
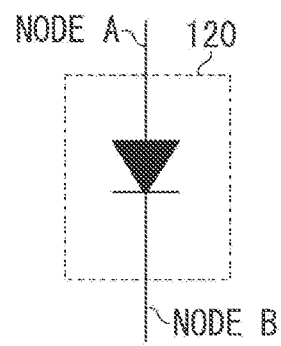

FIG. 3A illustrates an equivalent circuit of the pixel 100 in the photoelectric conversion device and a schematic view of the photoelectric conversion portion 120 in combination. FIG. 3B illustrates an equivalent circuit of the photoelectric conversion portion 120.

The pixel 100 illustrated in FIG. 3A corresponds to the pixel 100 illustrated in FIG. 1.

The pixel 100 includes the photoelectric conversion portion 120, an amplifying transistor (SF MOS) 106, a selection transistor (SEL MOS) 107, a reset transistor (RES MOS) 108, and a shutter transistor 111 (switch).

The photoelectric conversion portion 120 includes an upper electrode 101, a photoelectric conversion layer 103, and a pixel electrode 105. Furthermore, the photoelectric conversion portion 120 includes a first blocking layer 104 between the photoelectric conversion layer 103 and the pixel electrode 105. Moreover, the photoelectric conversion portion 120 includes a second blocking layer 102 between the photoelectric conversion layer 103 and the upper electrode 101.

A voltage Vs is supplied from the row drive circuit 201 to the upper electrode 101.

The first blocking layer 104 can be formed of a semiconductor material. The semiconductor material can be selected from among an inorganic semiconductor material, such as silicon, germanium, and gallium arsenide, and an organic semiconductor material. Moreover, a semiconductor material used to form the photoelectric conversion layer 103 and a semiconductor material used to form the first blocking layer 104 can be different from each other. Alternatively, a band gap of the semiconductor material used to form the photoelectric conversion layer 103 and a band gap of the semiconductor material used to form the first blocking layer 104 can be different from each other. The band gap is a difference between the lowest energy level of the conduction band and the highest energy level of the valence band. Furthermore, the material used to form the first blocking layer 104 is not limited to semiconductor materials.

Moreover, the photoelectric conversion layer 103 and the first blocking layer 104 can be formed of the same semiconductor material. In this case, the photoelectric conversion layer 103 and the first blocking layer 104 can be formed while causing the concentration of an impurity added to the semiconductor material to differ between the photoelectric conversion layer 103 and the first blocking layer 104.

The node B illustrated in FIG. 3A is connected to the pixel electrode 105 and the shutter transistor 111.

The node C illustrated in FIG. 3A is connected to the shutter transistor 111 and the gate of the amplifying transistor 106. Moreover, the node C is connected to the source of the reset transistor 108. The drain of the reset transistor 108 is connected to a node to which a reset voltage Vres (for example, assumed to be 3.3 V, which is equal to a power source voltage Vdd described below) is supplied. The gate of the amplifying transistor 106 is an input node of the pixel amplifying portion. With this configuration, the pixel amplifying portion amplifies a signal from the photoelectric conversion portion 120 and outputs the amplified signal to the output line 130.

The drain of the amplifying transistor 106 is connected to a node to which the power source voltage Vdd (for example, 3.3 V) is supplied. The source of the amplifying transistor 106 is connected to the output line 130 via the selection transistor 107. The selection transistor 107 turning on allows a current to be supplied from a current source 150 to the amplifying transistor 106 via the output line 130 and the selection transistor 107. With this, a source follower circuit is configured with the amplifying transistor 106 and the current source 150. The amplifying transistor 106, which configures the source follower circuit, outputs, to the output line 130, a signal corresponding to the signal output from the photoelectric conversion portion 120. The signal output from the amplifying transistor 106 of the pixel 100 is input to the column circuit 140.

FIG. 3B illustrates an equivalent circuit of the photoelectric conversion portion 120. The photoelectric conversion portion 120 forms a photodiode having a first terminal connected to the node A illustrated in FIG. 3A and a second terminal connected to the node B. The node A is supplied with the voltage Vs from the row drive circuit 201.

<Planar Structure of Pixel>

Figure 4:
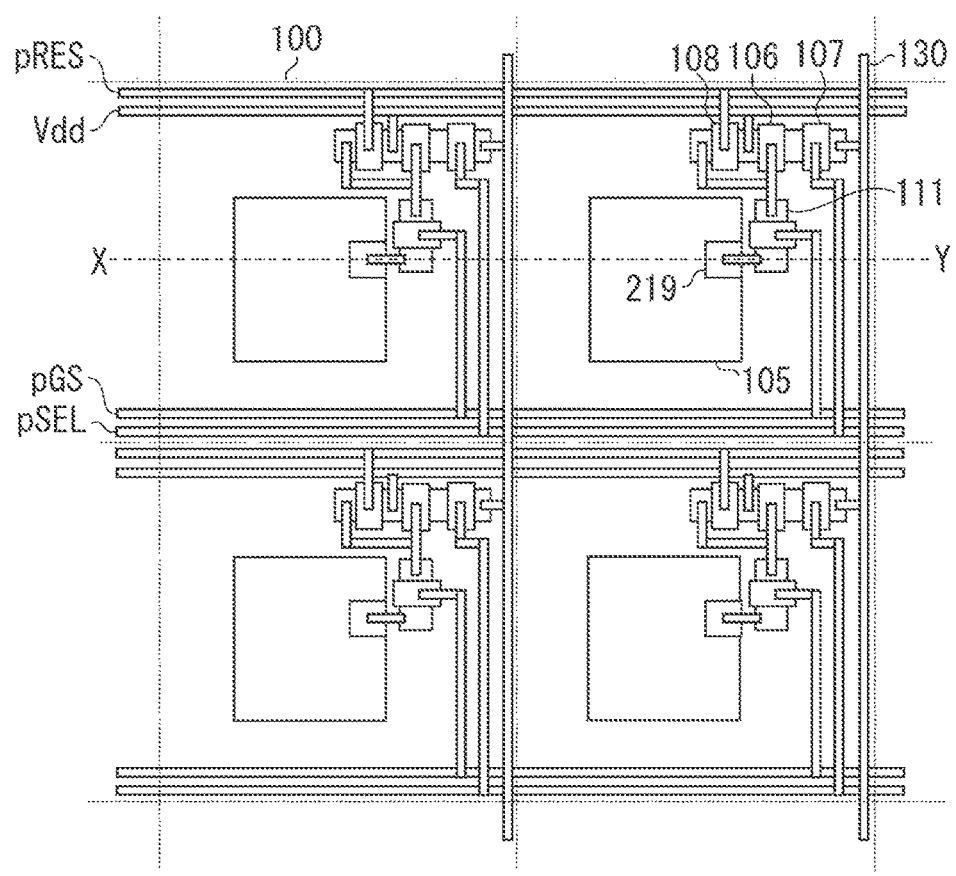
FIG. 4 illustrates a layout of pixels.

FIG. 4 schematically illustrates a planar structure of four pixels 100 arranged as a matrix with two rows and two columns. Each of the pixels 100 illustrated in FIG. 4 corresponds to the pixel 100 illustrated in FIG. 3A. In FIG. 4, members from the semiconductor substrate to the pixel electrode 105 are illustrated. Members stacked above the pixel electrode 105 are not illustrated.

Figure 5:
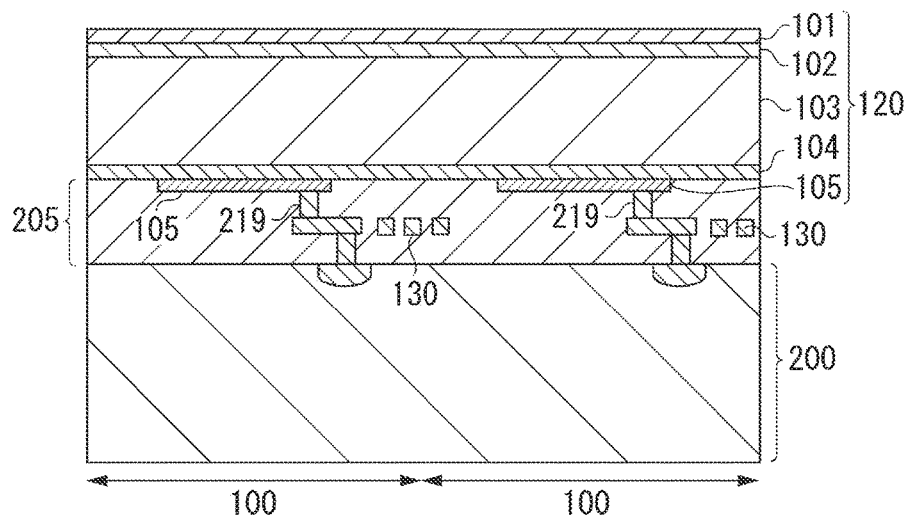
FIG. 5 illustrates a cross-section surface of a photoelectric conversion portion.

FIG. 5 schematically illustrates a cross-section structure of the pixel 100 of the photoelectric conversion device taken along a dashed line X-Y in FIG. 4.

In each of FIG. 4 and FIG. 5, members having the same functions as those of the members illustrated in FIG. 3A are assigned the respective same reference characters as the reference characters used in FIG. 3A. With regard to transistors, the corresponding gate electrodes are assigned the respective reference characters. FIG. 5 illustrates a cross-section structure of members from the semiconductor substrate 200 to the upper electrode 101.

The following description is made with reference to FIG. 4 and FIG. 5. The photoelectric conversion device includes the semiconductor substrate 200. The semiconductor substrate 200 is provided with an impurity semiconductor region (an impurity diffusion portion) (not illustrated), which includes sources and drains of pixel transistors. The pixel transistors respectively refer to the amplifying transistor 106, the selection transistor 107, and the reset transistor 108 illustrated in FIG. 3A. A plurality of wiring layers 205, which includes conductive members configuring the gates of the pixel transistors and the wiring lines, is arranged on the semiconductor substrate 200. The gate of the pixel transistor is typically formed of polysilicon. Each wiring line of the wiring layer 205 is typically formed of a conductive metal, such as aluminum or copper.

The upper electrode 101 is located above the semiconductor substrate 200. The pixel electrode 105 is located between the upper electrode 101 and the semiconductor substrate 200. The pixel electrode 105 is connected to the gate of the amplifying transistor 106 via a contact portion 219. Then, the photoelectric conversion layer 103 is located between the upper electrode 101 and the pixel electrode 105. The first blocking layer 104 is located between the photoelectric conversion layer 103 and the pixel electrode 105. The second blocking layer 102 is located between the upper electrode 101 and the photoelectric conversion layer 103.

The upper electrode 101 is electrically insulated for each row, as also illustrated in FIG. 1. On the other hand, as illustrated in FIG. 5, the pixel electrode 105 of each pixel 100 is electrically insulated from the pixel electrode 105 of another pixel 100. In this way, while the upper electrode 101 is formed over a plurality of pixels 100, the pixel electrode 105 is formed for each pixel.

<Functions of Photoelectric Conversion Portion and Electronic Shutter Operation>

Next, an operation of the pixel 100 and functions of the first blocking layer 104, the photoelectric conversion layer 103, and the second blocking layer 102 in the first exemplary embodiment are described in detail.

Figure 6:
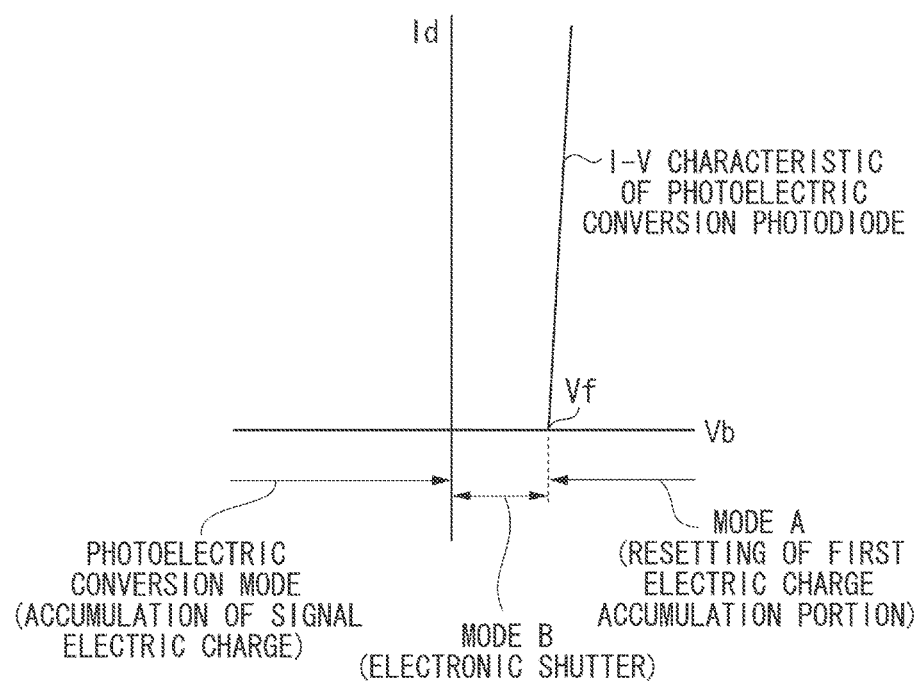
FIG. 6 illustrates an operation of the photoelectric conversion portion corresponding to a bias applied to the photoelectric conversion portion.

FIG. 6 illustrates a current-voltage characteristic (I-V characteristic) in a state in which no incident light falls on the photoelectric conversion portion 120 (in a dark state). In FIG. 6, the ordinate axis indicates a current Id flowing between the upper electrode 101 and the pixel electrode 105, and the abscissa axis indicates a voltage Vb applied to the photoelectric conversion portion 120. The voltage Vb is an electric potential difference between the upper electrode 101 and the pixel electrode 105. A voltage Vf is a rising voltage in the forward direction of the photodiode.

The magnitude relationship in electric potential between the upper electrode 101 and the pixel electrode 105 in a case where the photoelectric conversion portion 120 performs photoelectric conversion (in a photoelectric conversion mode) is a relationship in which the photoelectric conversion layer 103 enters a reverse bias state. When light falls on the photoelectric conversion layer 103, electrons and holes are generated in the photoelectric conversion layer 103. In a bias condition in the photoelectric conversion mode, electrons generated in the photoelectric conversion layer 103 move to the pixel electrode 105, and holes generated therein move to the upper electrode 101. The pixel electrode 105 accumulates the electrons generated in the photoelectric conversion layer 103.

In a mode A in which the voltage Vb is a voltage that causes the photoelectric conversion layer 103 to enter a forward bias state and is in a range higher than the rising voltage Vf, holes are injected from the upper electrode 101 into the pixel electrode 105 beyond an energy barrier of the first blocking layer 104. Holes being injected from the upper electrode 101 into the pixel electrode 105 cause a current to flow between the upper electrode 101 and the pixel electrode 105.

In a mode B in which the voltage Vb is a voltage that causes the photoelectric conversion layer 103 to enter the forward bias state and is in a range lower than the rising voltage Vf, the photoelectric conversion portion 120 enters a state of performing an electronic shutter operation described below.

Figure 7A:
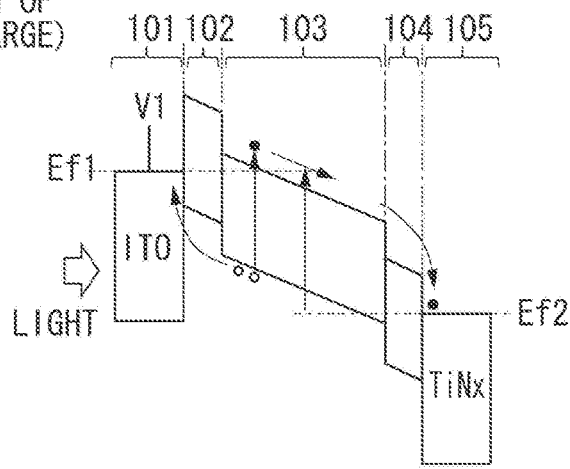
FIGS. 7A, 7B, and 7C illustrate energy band states in an operation of the photoelectric conversion portion.
Figure 7B:
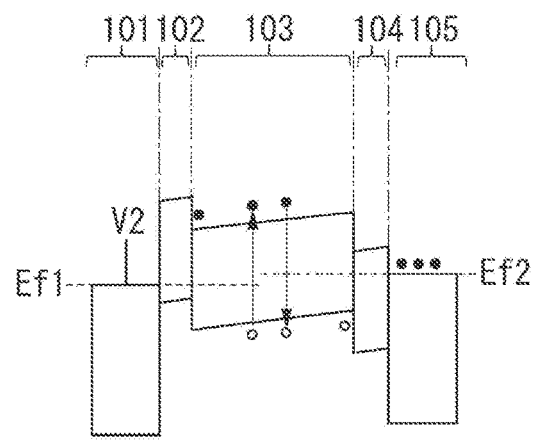
Figure 7C:
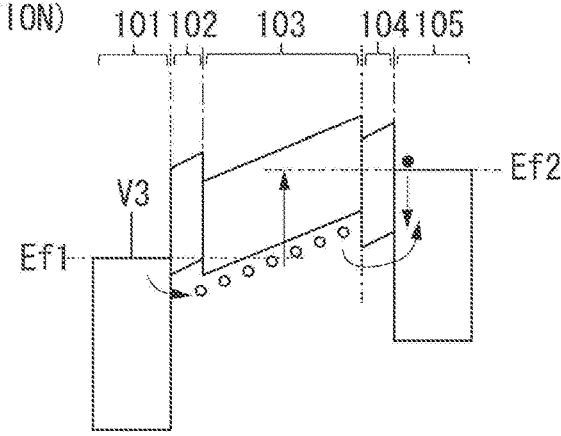

FIGS. 7A, 7B, and 7C schematically illustrate bias conditions of voltages applied to the photoelectric conversion portion 120 and energy band structures in the photoelectric conversion portion 120 in these bias conditions. FIG. 7A corresponds to the photoelectric conversion mode (a mode in which the pixel electrode 105 accumulates signal electric charge) in FIG. 6. FIG. 7B corresponds to the mode B (a mode of performing electronic shutter) in FIG. 6. FIG. 7C corresponds to the mode A (resetting of the first electric charge accumulation portion) in FIG. 6. The ordinate axis in FIGS. 7A to 7C indicates a potential relative to an electron. Accordingly, the voltage becomes higher as the position goes toward the lower portion in FIGS. 7A to 7C.

Each of FIGS. 7A to 7C illustrates energy bands of the upper electrode 101, the second blocking layer 102, the photoelectric conversion layer 103, the first blocking layer 104, and the pixel electrode 105. In FIG. 7A, as an example, a case where the upper electrode 101 is formed of indium tin oxide (ITO) and the pixel electrode 105 is formed of titanium nitride (TiNx) is illustrated. Hereinafter, also with regard to energy band diagrams illustrated in the other figures, unless otherwise stated, the materials of the upper electrode 101 and the pixel electrode 105 are the same as those illustrated in FIG. 7A.

The electric potential Ef1 illustrated in each of FIGS. 7A to 7C is the Fermi level of the upper electrode 101, and the electric potential Ef2 is the Fermi level of the pixel electrode 105. With regard to the second blocking layer 102, the photoelectric conversion layer 103, and the first blocking layer 104, a band gap between the conduction band and the valence band is illustrated.

FIG. 7A, which corresponds to the photoelectric conversion mode in FIG. 6, illustrates a potential in a state in which electrons serving as signal electric charge of the electric charge generated by a photoelectric conversion operation of the photoelectric conversion portion 120 are accumulated in the pixel electrode 105. An electron generated by photoelectric conversion is denoted by a filled circle, and a hole is denoted by an unfilled circle. To cause the photoelectric conversion portion 120 to enter the photoelectric conversion mode, the voltage Vs supplied to the upper electrode 101 is set to a voltage V1 (for example, 0 V), which is a first voltage. The photoelectric conversion layer 103, which is in the reverse bias state, is depleting.

Electrons serving as signal electric charge of the electric charge generated by the photoelectric conversion layer 103 move to the pixel electrode 105. During the photoelectric conversion mode, electrons generated by the photoelectric conversion layer 103 are progressively accumulated in the pixel electrode 105. The electric potential of the node B decreases according to the amount of signal electric charge accumulated in the pixel electrode 105. The decrease in electric potential of the node B causes the band structure of the photoelectric conversion layer 103 to change toward a flat band state.

Furthermore, the photoelectric conversion portion 120 is provided with the second blocking layer 102. This restricts injection of electrons from the upper electrode 101 into the photoelectric conversion layer 103. Therefore, it is possible to prevent the occurrence of a dark current, which would be generated by injection of electrons from the upper electrode 101 into the photoelectric conversion layer 103. Thus, the second blocking layer 102 is a second blocking portion configured to prevent injection of electrons, which are electric charge having the same polarity as that of signal electric charge, from the upper electrode 101 into the photoelectric conversion layer 103.

Holes generated by the photoelectric conversion layer 103 move toward the upper electrode 101 and are thus ejected to outside the photoelectric conversion portion 120.

The photoelectric conversion portion 120 is provided with the first blocking layer 104. This enables restricting injection of holes from the pixel electrode 105 into the photoelectric conversion layer 103. This also enables preventing the occurrence of recombination of holes and electrons in the photoelectric conversion layer 103. Therefore, a decrease in sensitivity which would occur due to injection of holes from the pixel electrode 105 into the photoelectric conversion layer 103 can be prevented. Thus, the first blocking layer 104 is a blocking portion configured to cause electrons serving as signal electric charge to be injected from the photoelectric conversion layer 103 into the pixel electrode 105, and to prevent injection of holes, which are electric charge having a polarity opposite to that of signal electric charge, from the photoelectric conversion layer 103 into the pixel electrode 105. Furthermore, the first electrode portion is the upper electrode 101, and the second electrode portion is the pixel electrode 105.

FIG. 7B illustrates a potential of the photoelectric conversion portion 120 which corresponds to the mode B in FIG. 6. In the mode B in FIG. 6, an electronic shutter operation is performed. A global electronic shutter can be implemented by all of the pixels 100 illustrated in FIG. 1 simultaneously performing each of the start of photoelectric conversion and the operation of shift from the photoelectric conversion mode to the mode B. To cause the photoelectric conversion portion 120 to enter the mode B, the voltage Vs supplied to the upper electrode 101 is set to a voltage V2 (for example, 3.3 V, the same as the voltage Vres), which is a second voltage. Since signal electric charge is electrons, the voltage V1 and the voltage V2 have a relationship of "V2>V1" with respect to electric potential.

In the mode B, the photoelectric conversion layer 103 is in a state close to the flat band state. In other words, injection of holes from the upper electrode 101 hardly occurs. Moreover, since a bias applied to the photoelectric conversion layer 103 is small, movement of holes generated by photoelectric conversion to the outside of the photoelectric conversion layer 103 hardly occurs. Movement of electrons generated by the photoelectric conversion layer 103 to the outside of the photoelectric conversion layer 103 also hardly occurs. Accordingly, a variation in the amount of electrons accumulated in the pixel electrode 105 hardly occurs. This state can be deemed to be a state in which electrons accumulated in the pixel electrode 105 are retained. Accordingly, in the pixel 100 in the first exemplary embodiment, the photoelectric conversion portion 120 shifts from the photoelectric conversion mode to the mode B, so that the electric charge accumulation period of the photoelectric conversion portion 120 ends.

FIG. 7C illustrates a potential of the photoelectric conversion portion 120 which corresponds to the mode A in FIG. 6. In the mode A, the row drive circuit 201 applies a voltage V3 to the upper electrode 101. In FIG. 7C, since the potential relative to electrons is illustrated, the voltage V3 and the voltage V2 have a relationship of "V3>V2". The voltage V3 has a value larger than that of the voltage Vf illustrated in FIG. 6. In the case of FIG. 7C, the photoelectric conversion layer 103 is in the forward bias state. Therefore, holes are injected from the upper electrode 101 into the photoelectric conversion layer 103 via the second blocking layer 102. Since the photoelectric conversion layer 103 is in the forward bias state, the injected holes move to the pixel electrode 105. Here, the voltage V3 is assumed to be a voltage to apply a large bias to between the upper electrode 101 and the pixel electrode 105 beyond an energy barrier of the first blocking layer 104. In this case, holes which have moved from the photoelectric conversion layer 103 to the first blocking layer 104 flow in the pixel electrode 105 beyond the energy barrier of the first blocking layer 104. The holes which have flowed in the pixel electrode 105 combine with electrons accumulated in the node B in the photoelectric conversion mode. This causes the electric potential of the node B, which is the first electric charge accumulation portion, to be reset to an electric potential obtained before the photoelectric conversion portion 120 enters the photoelectric conversion mode.

<Global Electronic Shutter Operation>

Next, a driving method for the photoelectric conversion device according to the first exemplary embodiment is described.

Figure 8:
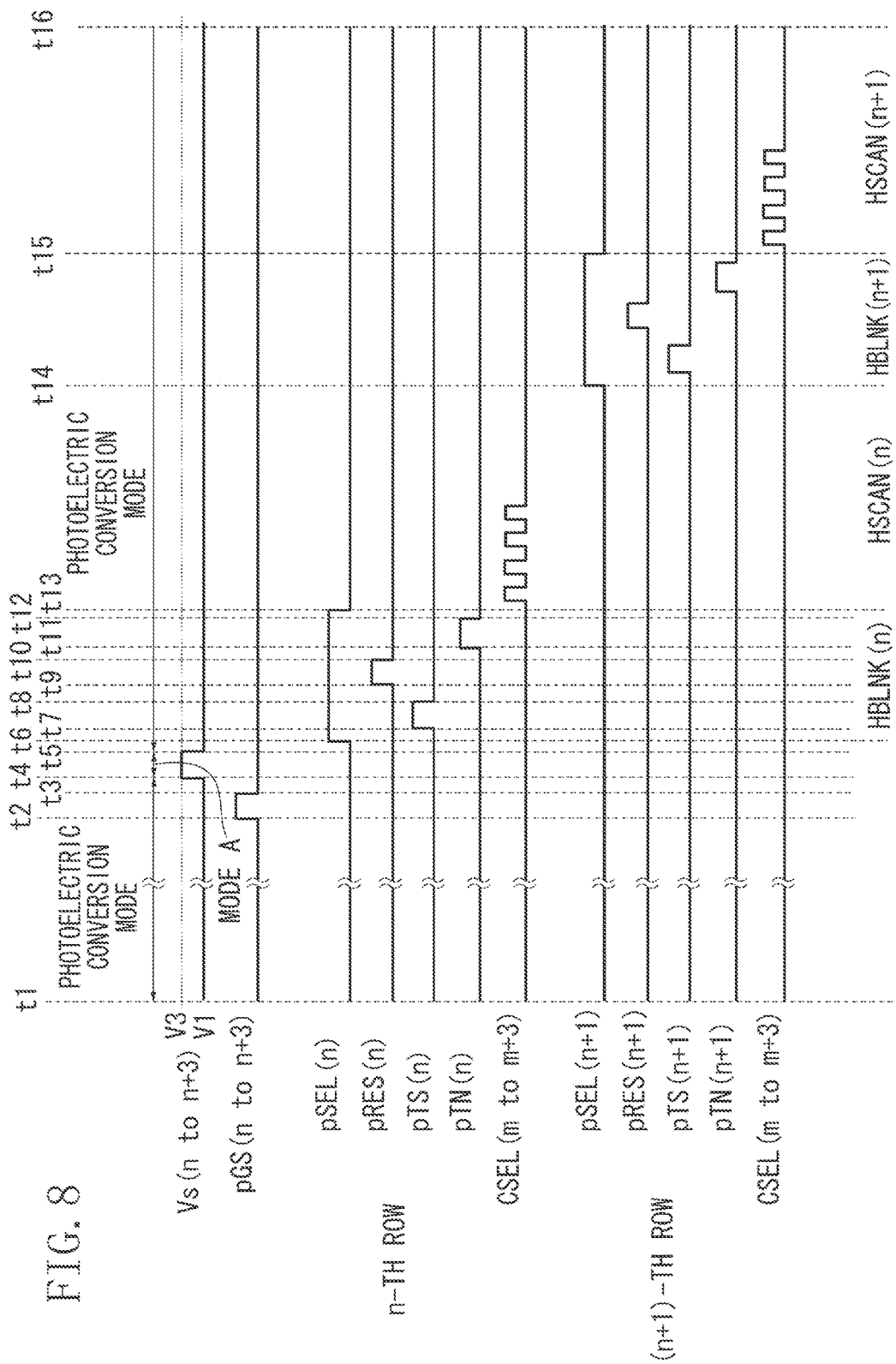
FIG. 8 illustrates an operation of the photoelectric conversion device.

FIG. 8 is a timing chart of drive signals for use in the photoelectric conversion device according to the first exemplary embodiment. In FIG. 8, for ease of description, signals corresponding to a signal reading operation for two rows, i.e., the n-th row and the (n+1)-th row, are illustrated.

Furthermore, in the operation illustrated in FIG. 8, the photoelectric conversion portion 120 is assumed not to perform an operation in the mode B. Thus, all of the periods other than periods in which the photoelectric conversion portion 120 is in the mode A are periods in which the photoelectric conversion portion 120 is in the photoelectric conversion mode. Furthermore, in a case where only some periods other than periods of the mode A are set to periods of the photoelectric conversion mode, the remaining other periods can be set to periods of the mode B.

During a period from time t1 to time t4, the row drive circuit 201 sets the voltages Vs(n to n+3), which are applied to the pixels 100 in all of the rows illustrated in FIG. 1, to the voltage V1. With this, the photoelectric conversion portions 120 of all of the pixels 100 illustrated in FIG. 1 operate in the photoelectric conversion mode. Furthermore, although not illustrated, prior to time t1, the row drive circuit 201 sets the voltages Vs(n to n+3), which are applied to the pixels 100 in all of the rows illustrated in FIG. 1, to the voltage V3, as in a period from time t4 to time t5 described below. With this, signal electric charge in the node B of each of all of the pixels 100 illustrated in FIG. 1 is previously reset collectively in all of the pixels 100. Accordingly, the start of an electric charge accumulation period of the photoelectric conversion portion 120 of each of all of the pixels 100 is set to the same time in all of the pixels 100.

At time t2, the row drive circuit 201 sets the drive signals pGS(n to n+3) to high level. With this, the shutter transistors 111 of all of the pixels 100 illustrated in FIG. 1 are turned on. Accordingly, the transfer of signal electric charge accumulated by the node B to the node C is started. The shutter transistor 111 is a transfer portion configured to transfer electric charge accumulated by the node B, which is the first electric charge accumulation portion, to the node C.

At time t3, the row drive circuit 201 sets the drive signals pGS(n to n+3) to low level. With this, the shutter transistors 111 of all of the pixels 100 illustrated in FIG. 1 are turned off. Accordingly, signal electric charge accumulated by the node B for a period until time t3 is transferred to the node C. With this, the electric charge accumulation periods of all of the pixels 100 illustrated in FIG. 1 simultaneously end in all of the pixels 100. Thus, a global electronic shutter operation, in which each of the start and end of the electric charge accumulation periods of all of the pixels 100 occurs at the same time, is performed.

During a period from time t4 to time t5, the row drive circuit 201 sets the voltages Vs(n to n+3), which are applied to the pixels 100 in all of the rows illustrated in FIG. 1, to the voltage V3. With this, the photoelectric conversion portions 120 of all of the pixels 100 illustrated in FIG. 1 operate in the mode A. Accordingly, at time t5, the electric potential of the node B, which is the first electric charge accumulation portion, is reset to the initial state obtained before photoelectric conversion.

At time t5, the row drive circuit 201 sets the voltages Vs(n to n+3), which are applied to the pixels 100 in all of the rows illustrated in FIG. 1, to the voltage V1 again. With this, the photoelectric conversion portions 120 of all of the pixels 100 illustrated in FIG. 1 operate in the photoelectric conversion mode. Accordingly, as mentioned above, the start of an electric charge accumulation period of the photoelectric conversion portion 120 of each of all of the pixels 100 illustrated in FIG. 1 is set to the same time in all of the pixels 100.

At time t6, the row drive circuit 201 sets the drive signal pSEL(n) to high level. With this, the selection transistors 107 of the pixels 100 in the n-th row are turned on. Accordingly, the amplifying transistors 106 of the pixels 100 in the n-th row output signals to the output lines 130.

At time t7, the timing generator sets the signal pTS(n) to high level. Then, at time t8, the timing generator sets the signal pTS(n) to low level. With this, the capacitance CTS of the column circuit 140 retains a signal S which is a photo signal containing the photo signal accumulated in the node B and a threshold variation of the amplifying transistor 106.

At time t9, the row drive circuit 201 sets the signal pRES(n) to high level. Then, at time t10, the row drive circuit 201 sets the signal pRES(n) to low level. With this, the electric potential of the node C, which is the second electric charge accumulation portion, becomes the electric potential of the reset level.

At time t11, the timing generator sets the signal pTN(n) to high level. Then, at time t12, the timing generator sets the signal pTN(n) to low level. With this, the capacitance CTN of the column circuit 140 retains a signal N which is a noise signal containing a threshold variation of the amplifying transistor 106.

At time t13, the row drive circuit 201 sets the signal pSEL(n) to low level.

After that, the column drive circuit 202 sequentially sets the signals CSEL(m to m+3) for the column circuits 140 in the respective columns to high level. With this, the column circuits 140 in the respective columns sequentially output the signal S and the signal N to the output amplifier portion 203. The output amplifier portion 203 outputs a signal indicating a difference between the signal S and the signal N to the AD conversion portion 204.

After that, the row drive circuit 201, the timing generator, and the column drive circuit 202 sequentially perform, with respect to the pixels 100 in the other rows, operations performed on the pixels 100 in the n-th row during a period from time t6 to time t13.

Accordingly, the photoelectric conversion device according to the first exemplary embodiment is able to obtain a signal corresponding to incident light on each pixel 100. Moreover, the photoelectric conversion device according to the first exemplary embodiment is able to perform a global electronic shutter operation by causing the level of the voltage Vs and the level of the drive signal pGS to be shared by all of the pixels 100.

In the first exemplary embodiment, during the photoelectric conversion mode, a voltage to bring the photoelectric conversion portion 120 into the reverse bias state is applied to the upper electrode 101. This causes the node B, which is the first electric charge accumulation portion, to retain signal electric charge. Moreover, during the mode A, a voltage to bring the photoelectric conversion portion 120 into the forward bias state is applied to the upper electrode 101. This resets signal electric charge accumulated in the node B, which is the first electric charge accumulation portion.

<Effect Obtained by Provision of Photoelectric Conversion Portion 120 Having Diode Characteristic>

In the photoelectric conversion device discussed in Japanese Patent Application Laid-Open No. 2014-82293, a transistor for resetting the photoelectric conversion portion is required to be provided separately from a transistor for resetting the second electric charge accumulation portion. The photoelectric conversion device according to the first exemplary embodiment is provided with the photoelectric conversion portion 120 having a diode characteristic. This enables resetting signal electric charge accumulated in the first electric charge accumulation portion without including a transistor for resetting the photoelectric conversion portion 120. Accordingly, the photoelectric conversion device according to the first exemplary embodiment has an effect capable of reducing the circuit area of the pixel 100 as much as a transistor for resetting the first electric charge accumulation portion can be omitted, as compared with a conventional photoelectric conversion device.

Furthermore, while, in the first exemplary embodiment, an operation of the global electronic shutter is described, what is called a rolling shutter operation, in which timing of the electric charge accumulation period sequentially varies with rows, can also be performed.

Moreover, in the first exemplary embodiment, a photoelectric conversion device including pixels 100 with four rows and four columns is described as an example. Actually, the pixels 100 of the photoelectric conversion device are formed with thousands of rows and thousands of columns. The global electronic shutter operation described in the first exemplary embodiment can be performed with respect to the pixels 100 arranged with thousands of rows and thousands of columns.

<Configuration of First Blocking layer 104>

The first blocking layer 104, the photoelectric conversion layer 103, and the second blocking layer 102 in the first exemplary embodiment can be made to configure a homojunction. Thus, the first blocking layer 104, the photoelectric conversion layer 103, and the second blocking layer 102 can be made to be formed of the same semiconductor material. The term "same semiconductor material" refers to respective elements which are most contained in the first blocking layer 104, the photoelectric conversion layer 103, and the second blocking layer 102 being the same. For example, suppose that the first blocking layer 104, the photoelectric conversion layer 103, and the second blocking layer 102 are respectively formed of semiconductors formed by adding an impurity to silicon. In this case, respective elements which are most contained in the first blocking layer 104, the photoelectric conversion layer 103, and the second blocking layer 102 are silicon. Accordingly, the first blocking layer 104, the photoelectric conversion layer 103, and the second blocking layer 102 can be said to be formed of the "same semiconductor material".

The material used to make the photoelectric conversion layer 103 includes a semiconductor material, a compound semiconductor, and an organic semiconductor. Examples of the semiconductor material include intrinsic amorphous silicon, low-concentration P-type amorphous silicon, and low-concentration N-type amorphous silicon. Examples of the compound semiconductor include a III-V group compound semiconductor, such as boron nitride (BN), gallium arsenide (GaAs), gallium phosphide (GaP), aluminum antimonide (AlSb), and gallium aluminum arsenide phosphide (GaAlAsP), and a II-VI group compound semiconductor, such as cadmium selenide (CdSe), zinc sulfide (ZnS), and cadmium telluride (CdTe). Examples of the organic semiconductor include a phthalocyanine-series material, such as fullerene, coumalin 6 (C6), rhodamine 6G (R6G), quinacridone, and zinc phthalocyanine (ZnPc), and a naphthalocyanine-series material.

Furthermore, a layer containing quantum dots configured with the above-mentioned semiconductor material can be used as the photoelectric conversion layer 103. An amorphous silicon film, an organic semiconductor film, and a quantum dot film are available to readily form a thin film. Here, the term "quantum dot" refers to a particle with a particle size of 20.0 nanometers (nm) or less.

Moreover, an intrinsic semiconductor is low in carrier density. Therefore, using the intrinsic semiconductor for the photoelectric conversion layer 103 enables attaining a wide depletion layer width. This enables implementing a photoelectric conversion layer 103 with a high sensitivity and with an improved noise-reduction effect.

The upper electrode 101 is formed of a material which allows light incident via a microlens layer (not illustrated)

and a color filter layer (not illustrated) to pass through the upper electrode 101 and fall on the photoelectric conversion layer 103. For example, a transparent electrode of, for example, a compound or oxide containing indium and tin, such as ITO, can be used for the upper electrode 101. Since using the transparent electrode enables preventing a decrease in the amount of incident light due to passing through the upper electrode 101, a decrease in sensitivity of the photoelectric conversion portion 120 can be prevented or reduced. As another example of the upper electrode 101, a polysilicon material or metal having such a small thickness as to allow a predetermined amount of light to pass therethrough can be used as the upper electrode 101. Since metals are lower in electrical resistance than oxides, using a metal as the material of the upper electrode 101 enables a reduction in power consumption and an increase in speed of driving as compared with using an oxide as the material of the upper electrode 101.

In a case where the first blocking layer 104, the photoelectric conversion layer 103, and the second blocking layer 102 are respectively formed of the "same semiconductor materials", the concentrations of impurities contained in the respective semiconductor materials are set in such a way as to differ from each other. For example, the second blocking layer 102 is formed of a P-type semiconductor material, the photoelectric conversion layer 103 is formed of an intrinsic semiconductor, and the first blocking layer 104 is formed of an N-type semiconductor material. Thus, the conductivity type (type I) of the photoelectric conversion layer 103 and the conductivity type (type N) of the first blocking layer 104, which is a blocking portion, are different from each other. Moreover, the conductivity type (type N) of the first blocking layer 104 and the conductivity type (type P) of the second blocking layer 102 are different from each other.

Furthermore, the first blocking layer 104 can be formed of a material different from that of the photoelectric conversion layer 103. In the case of such a configuration, a heterojunction is formed between the first blocking layer 104 and the photoelectric conversion layer 103. A difference in material between the first blocking layer 104 and the photoelectric conversion layer 103 causes an energy barrier to be generated between the first blocking layer 104 and the photoelectric conversion layer 103. Accordingly, this heterojunction enables preventing (blocking) the injection of electric charge opposite in polarity to the signal electric charge from the photoelectric conversion layer 103 into the pixel electrode 105. Furthermore, the term "different material" as used herein refers to principal elements used to form the respective layers being different from each other.

<Effect Obtained by Provision of First Blocking Layer 104>

An effect of the first exemplary embodiment is described with reference to each of FIGS. 9A to 9E. FIGS. 9B and 9C illustrate reference examples in a case where the photoelectric conversion portion 120 is not provided with the first blocking layer 104. FIGS. 9D and 9E illustrate examples in a case where the photoelectric conversion portion 120 is provided with the first blocking layer 104, as described above in the first exemplary embodiment.

FIG. 9A illustrates an image incident on the photoelectric conversion device. A photo signal of the pixel 100 located at position P1 is at a level close to a dark level, and a photo signal of the pixel 100 located at position P2 is at a level close to a saturation level. In this way, depending on an imaging scene, a pixel P1 close to a dark level and a pixel P2 close to a saturation level are present in a single image.

The reference examples illustrated in FIGS. 9B and 9C are described. FIG. 9B illustrates a band structure of the photoelectric conversion portion 120 in the pixel P1. FIG. 9C illustrates a band structure of the photoelectric conversion portion 120 in the pixel P2. Solid lines drawn in each of FIGS. 9B and 9C indicate a band structure in a photoelectric conversion region. Dashed lines drawn in each of FIGS. 9B and 9C indicate a band structure in the mode B.

In the photoelectric conversion portion 120 in the pixel P1 illustrated in FIG. 9B, during the photoelectric conversion mode, as indicated by solid lines, electrons caused by the photo signal are hardly accumulated in the pixel electrode 105. Therefore, in the photoelectric conversion mode, the band structure of the photoelectric conversion portion 120 in the pixel P1 remains at a potential close to a reverse bias state obtained at the time of resetting of the photoelectric conversion portion 120.

In the photoelectric conversion portion 120 in the pixel P2 illustrated in FIG. 9C, during the photoelectric conversion mode, as indicated by solid lines, electrons caused by the photo signal are accumulated in the pixel electrode 105, so that the electric potential of the node B is lowered. Therefore, in the photoelectric conversion mode, the band structure of the photoelectric conversion portion 120 in the pixel P2 is in a state close to a flat band state.

Here, suppose that the electric potential of the voltage V2 is set in such a manner that the pixel P1, which outputs a photo signal close to a dark level, exhibits a flat band in the mode B. Therefore, as indicated by dashed lines in FIG. 9B, in the mode B, the photoelectric conversion portion 120 in the pixel P1 is in a state close to a flat band state.

In the photoelectric conversion portion 120 in the pixel P2 illustrated in FIG. 9C, during the mode B, as indicated by dashed lines, the electric potential of the upper electrode 101 becomes relatively higher than the electric potential of the pixel electrode 105. Therefore, while the photoelectric conversion portion 120 is in the mode B, holes generated in the photoelectric conversion layer 103 become likely to move to the pixel electrode 105.

The holes generated in the photoelectric conversion layer 103 moving to the pixel electrode 105 cause electrons accumulated in the pixel electrode 105 to disappear. Therefore, the photo signal in the pixel P2 becomes at a signal level lower than a signal level to be originally output. With this, in an image generated by using signals output from the photoelectric conversion device, the luminance of a high-luminance portion is lowered. In other words, an image with contrast lowered as compared with an image assumed to be generated without disappearance of electrons accumulated in the pixel electrode 105 is generated.

The photoelectric conversion portion 120 in the first exemplary embodiment includes the first blocking layer 104.

FIG. 9D illustrates a band structure of the pixel P1 provided with the photoelectric conversion portion 120 in the first exemplary embodiment. In FIG. 9D, as with FIG. 9B, in the mode B, the photoelectric conversion portion 120 in the pixel P1 is in a state close to a flat band state.

In FIG. 9E, a band structure in a case where the photoelectric conversion portion 120 in the pixel P2 is in the mode B is indicated by dashed lines. The movement of holes generated in the photoelectric conversion layer 103 from the photoelectric conversion layer 103 to the pixel electrode 105 is prevented by the first blocking layer 104.

In this way, since the photoelectric conversion portion 120 includes the first blocking layer 104, the movement of holes generated in the photoelectric conversion layer 103 to the pixel electrode 105 is prevented. Therefore, the disappearance of electrons accumulated in the pixel electrode 105, which would occur in the case of FIG. 9C, is also prevented.

Moreover, a decrease in signal level of the photo signal output from the pixel P2, which would occur in the case of FIG. 9C, is also prevented. With this, a decrease in luminance of a high-luminance portion in an image generated by using signals output from the photoelectric conversion device, which would occur in the case of FIG. 9C, is also prevented. Accordingly, the photoelectric conversion device according to the first exemplary embodiment has an effect capable of preventing a decrease in contrast of an image, which would occur in a conventional electronic shutter operation.

However, while, in the first exemplary embodiment, the attainment of the above-mentioned effect by the photoelectric conversion portion 120 including the first blocking layer 104 is described, this is not an essential configuration. In a case where, as in the operation illustrated in FIG. 8, the photoelectric conversion portion 120 does not operate in the mode B, it is not necessary to prevent the injection of holes from the photoelectric conversion layer 103 into the pixel electrode 105 in the mode B. Therefore, without providing the first blocking layer 104, the photoelectric conversion device according to the first exemplary embodiment is able to obtain an effect of reducing the circuit area of the pixel 100 by omitting a transistor for resetting the first electric charge accumulation portion, as mentioned above.

Furthermore, while, in the first exemplary embodiment, a case in which signal electric charge is electrons is described, a similar effect can be attained even in a case where signal electric charge is holes.

A photoelectric conversion device according to a second exemplary embodiment is described with reference to FIG. 10 mainly about portions different from those in the first exemplary embodiment.

Figure 10:
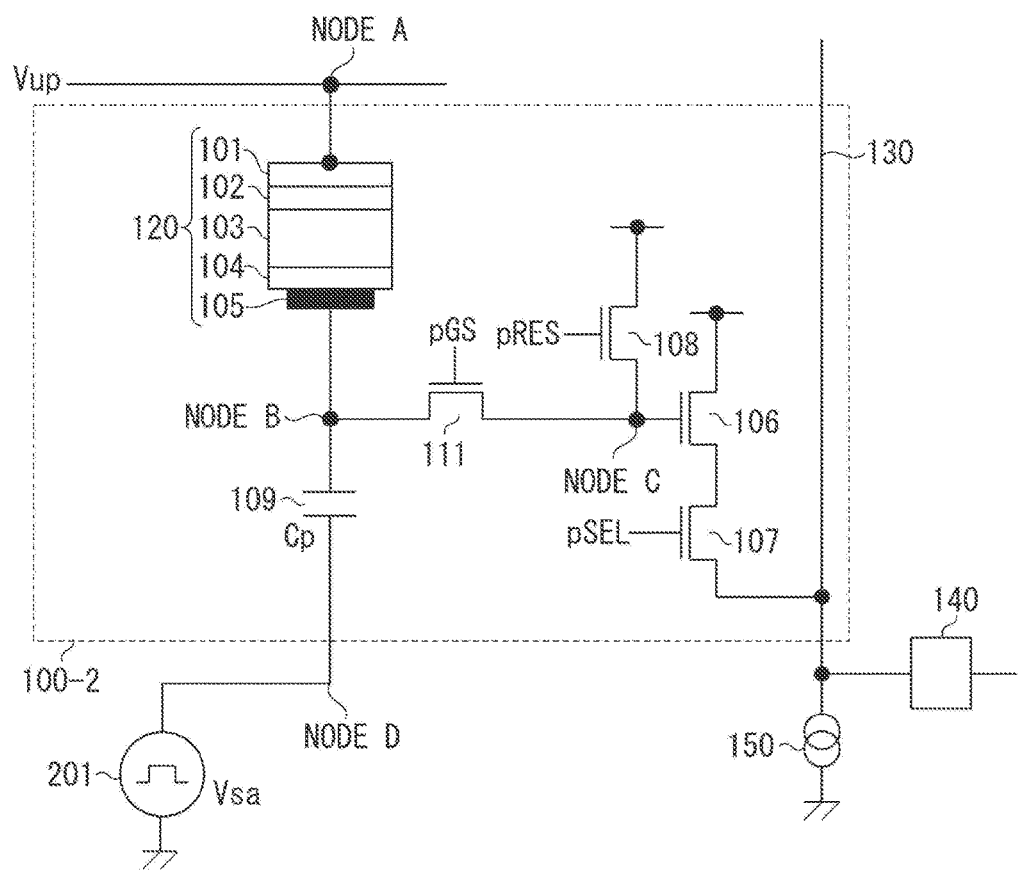
FIG. 10 illustrates a circuit configuration of a pixel.

FIG. 10 illustrates a configuration of a pixel 100-2 in the second exemplary embodiment. The entire configuration of the photoelectric conversion device according to the second exemplary embodiment is a configuration in which the pixel 100 is replaced by the pixel 100-2 in the configuration illustrated in FIG. 1.

As illustrated in FIG. 10, the pixel 100-2 in the second exemplary embodiment includes a capacitance Cp (109) having one end connected to the node B. The other node of the capacitance Cp (109) is connected to a node D, to which a voltage Vsa is supplied from the row drive circuit 201.

In the first exemplary embodiment, the row drive circuit 201 supplies the voltage Vs to the upper electrode 101. On the other hand, in the second exemplary embodiment, as illustrated in FIG. 10, the row drive circuit 201 supplies the voltage Vsa to the node D. Furthermore, the node A, to which the upper electrode 101 is connected, is supplied with a voltage Vup, which is a predetermined voltage, from a second voltage supply portion (not illustrated).

Also in the case of the second exemplary embodiment, during the photoelectric conversion mode, the row drive circuit 201 sets the level of the voltage Vsa to a voltage which causes the photoelectric conversion layer 103 to enter the reverse bias state. Moreover, during the mode A, the row drive circuit 201 sets the level of the voltage Vsa in such a manner that the voltage Vb is in a range that causes the photoelectric conversion layer 103 to enter the forward bias state and is in a range higher than the rising voltage Vf. With this, the photoelectric conversion device according to the second exemplary embodiment is also able to perform the photoelectric conversion operation and the resetting operation for the first electric charge accumulation portion, as in the first exemplary embodiment. Accordingly, the photoelectric conversion device according to the second exemplary embodiment also has the same effect as that of the photoelectric conversion device according to the first exemplary embodiment.

Furthermore, during the mode B, the row drive circuit 201 sets the level of the voltage Vsa in such a manner that the voltage Vb is in a range that causes the photoelectric conversion layer 103 to enter the forward bias state and is in a range lower than the rising voltage Vf. This enables providing a period for preventing further accumulation of signal electric charge from the photoelectric conversion layer 103 to the node B, which is the first electric charge accumulation portion.

The photoelectric conversion device according to the second exemplary embodiment also performs resetting of the node B, which is the first electric charge accumulation portion, by causing the photoelectric conversion portion 120 to operate in the mode A. With this, as with the photoelectric conversion device according to the first exemplary embodiment, the photoelectric conversion device according to the second exemplary embodiment also has an effect capable of reducing the circuit area of the pixel 100-2 as compared with a conventional photoelectric conversion device.

Furthermore, also in the photoelectric conversion device according to the second exemplary embodiment, the photoelectric conversion portion 120 includes the first blocking layer 104. Therefore, the photoelectric conversion device according to the second exemplary embodiment also has an effect capable of preventing a decrease in contrast of an image, which would occur in a conventional electronic shutter operation.

A photoelectric conversion device according to a third exemplary embodiment is described with reference to FIG. 11 mainly about portions different from those in the first exemplary embodiment.

The configuration of the photoelectric conversion device according to the third exemplary embodiment can be the same as that illustrated in FIG. 1.

Figure 11:
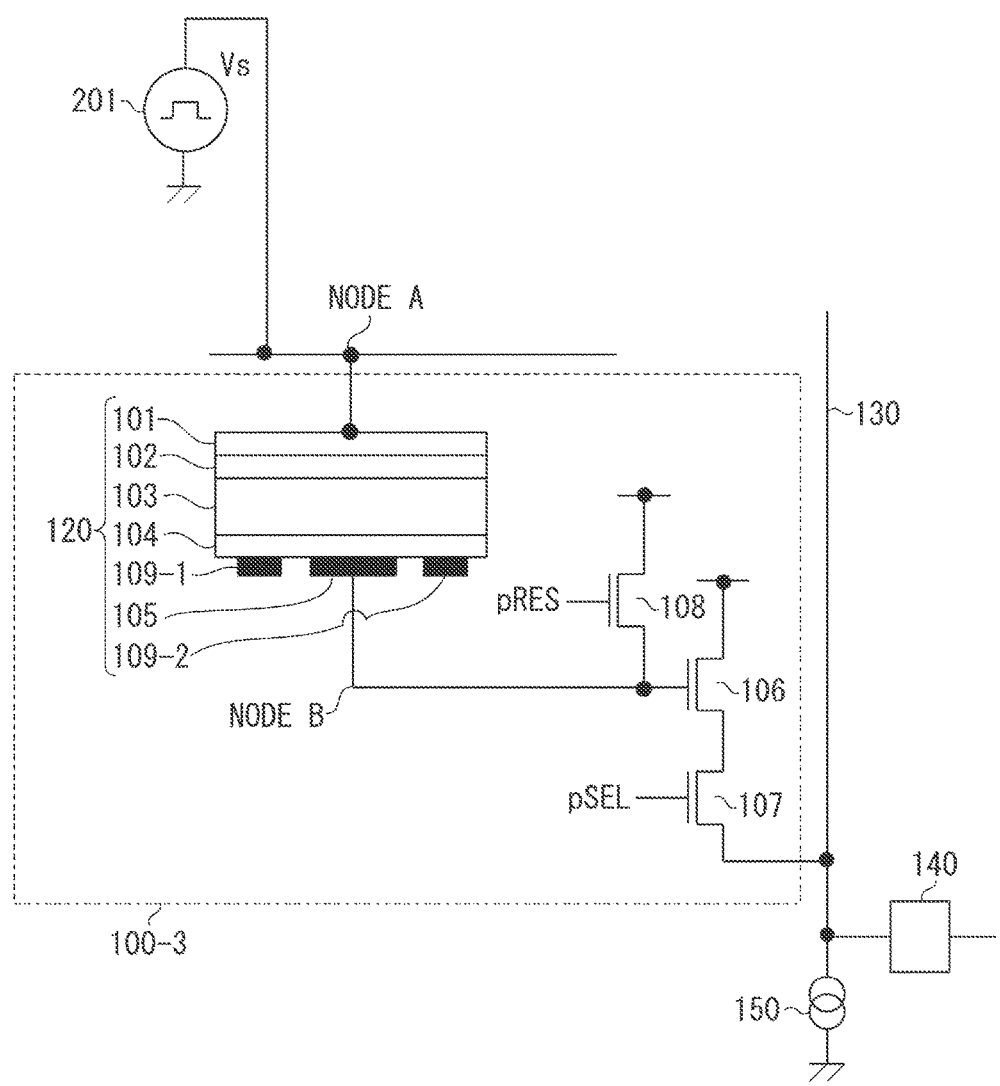
FIG. 11 illustrates a circuit configuration of a pixel.

FIG. 11 illustrates a configuration of a pixel 100-3 in the third exemplary embodiment. In the members illustrated in FIG. 11, members having the same functions as the members illustrated in FIG. 3A are assigned the respective same reference characters as those assigned in FIG. 3A. The pixel 100-3 in the third exemplary embodiment further includes auxiliary electrodes 109-1 and 109-2 in addition to the pixel electrode 105.

In a case where the photoelectric conversion portion 120 is in the mode B (an electronic shutter operation), both the auxiliary electrodes 109-1 and 109-2 are supplied with a predetermined drain voltage from a drain power source (not illustrated). In a case where signal electric charge is electrons, the drain voltage is set to a value larger than 0 V. On the other hand, in a case where signal electric charge is holes, the drain voltage is set to a value smaller than 0 V.

Therefore, during a period in which the photoelectric conversion portion 120 is in the mode B, electric charge opposite in polarity to signal electric charge drifting from the photoelectric conversion portion 120 toward the pixel electrode 105 is attracted to the auxiliary electrodes 109-1 and 109-2. With this, electric charge opposite in polarity to signal electric charge is ejected from the auxiliary electrodes 109-1 and 109-2. This enables preventing combination of signal electric charge accumulated in the pixel electrode 105 and electric charge opposite in polarity to the signal electric charge. Accordingly, the photoelectric conversion portion 120 including the auxiliary electrodes 109-1 and 109-2 enables the photoelectric conversion device according to the third exemplary embodiment to have an effect capable of precisely reading out signal electric charge accumulated in the pixel electrode 105.

Furthermore, the photoelectric conversion device according to the third exemplary embodiment also performs resetting of the node B, which is the first electric charge accumulation portion, by causing the photoelectric conversion portion 120 to operate in the mode A. With this, as with the photoelectric conversion device according to the first exemplary embodiment, the photoelectric conversion device according to the third exemplary embodiment also has an effect capable of reducing the circuit area of the pixel 100-3 as compared with a conventional photoelectric conversion device.

A photoelectric conversion device according to a fourth exemplary embodiment is described with reference to FIG. 12 and FIGS. 13A and 13B mainly about portions different from those in the first exemplary embodiment.

Figure 12:
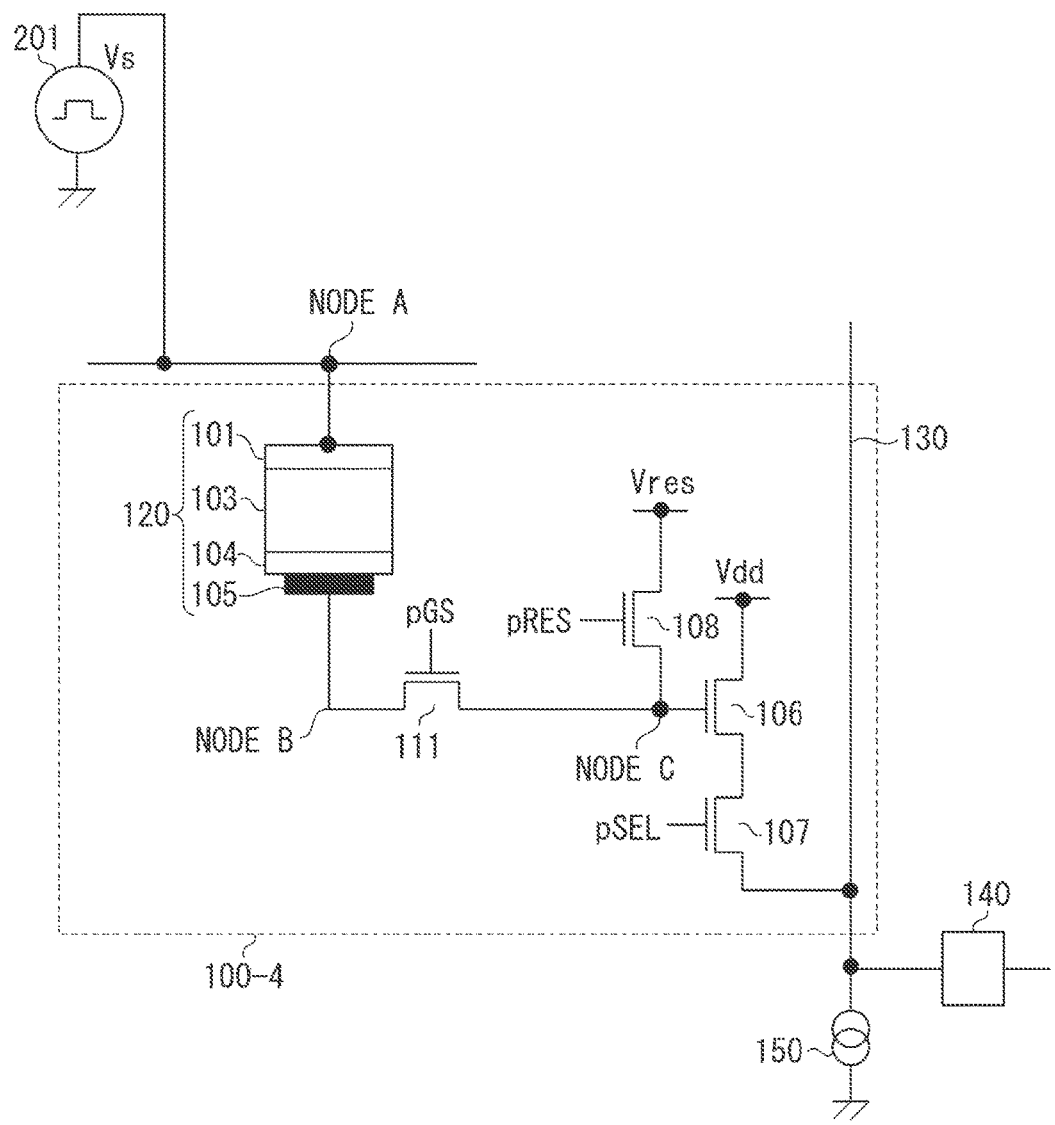
FIG. 12 illustrates a circuit configuration of a pixel.

FIG. 12 illustrates a configuration of a pixel 100-4 included in the photoelectric conversion device according to the fourth exemplary embodiment. In the members illustrated in FIG. 12, members having the same functions as the members illustrated in FIG. 3A are assigned the respective same reference characters as those assigned in FIG. 3A.

The pixel 100-4 in the fourth exemplary embodiment is not provided with the second blocking layer 102, which is included in the photoelectric conversion portion 120 illustrated in FIG. 3A, and, instead, is provided with a Schottky barrier between the upper electrode 101 and the photoelectric conversion layer 103. This Schottky barrier serves the same function as that of the second blocking layer 102 included in the photoelectric conversion portion 120 illustrated in FIG. 3A. Thus, in the fourth exemplary embodiment, the Schottky barrier serves as a second blocking portion configured to prevent injection of electrons, which are electric charge equal in polarity to signal electric charge, from the upper electrode 101 into the photoelectric conversion layer 103.

Figure 13A:
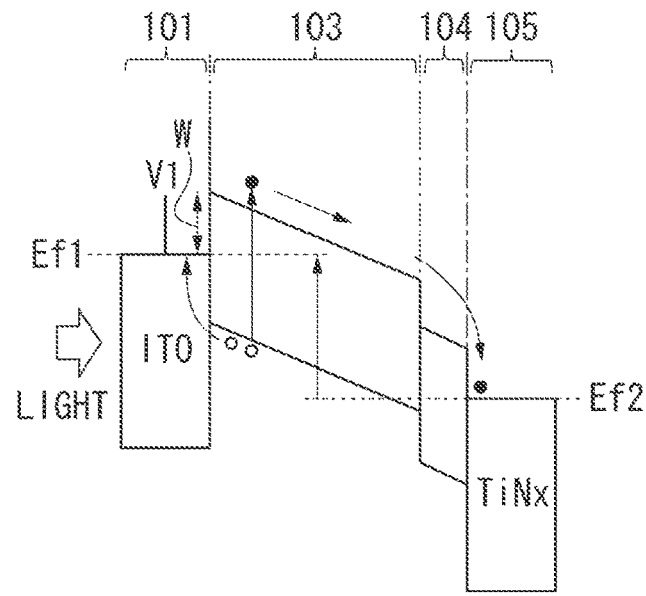
FIGS. 13A and 13B illustrate energy band states in an operation of a photoelectric conversion portion.
Figure 13B:
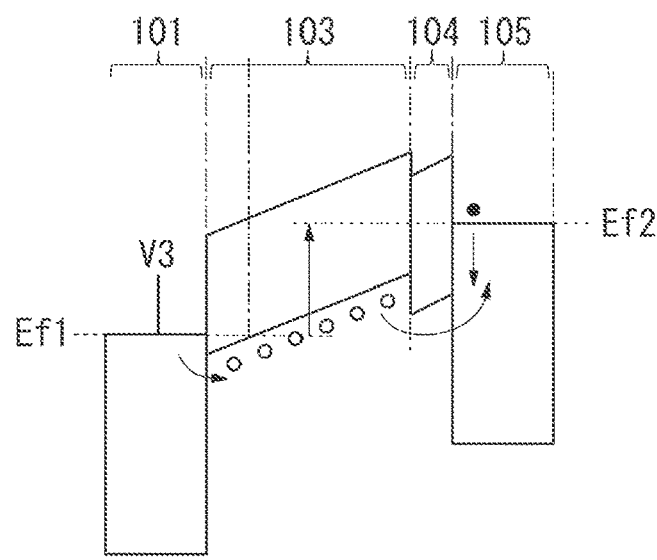

FIGS. 13A and 13B schematically illustrate potentials about energy bands and bias voltages to be applied in the photoelectric conversion portion 120 in the fourth exemplary embodiment. FIG. 13A is associated with the photoelectric conversion mode indicated in FIG. 6, and FIG. 13B is associated with the mode A indicated in FIG. 6.

FIGS. 13A and 13B illustrate energy bands of the upper electrode 101, the photoelectric conversion layer 103, the first blocking layer 104, and the pixel electrode 105.

In the fourth exemplary embodiment, the photoelectric conversion portion 120 is not provided with the second blocking layer 102, and, instead, is provided with a Schottky barrier W between the upper electrode 101 and the photoelectric conversion layer 103. With this, in the photoelectric conversion mode illustrated in FIG. 13A, the photoelectric conversion portion 120 prevents (blocks) signal electric charge (also assumed to be electrons in the fourth exemplary embodiment) from being injected from the upper electrode 101 into the photoelectric conversion layer 103.

Furthermore, the first blocking layer 104, which has an energy barrier with respect to holes serving as electric charge opposite in polarity to signal electric charge, is provided between the photoelectric conversion layer 103 and the pixel electrode 105. In the photoelectric conversion mode illustrated in FIG. 13A, as in the first exemplary embodiment, the first blocking layer 104 prevents (blocks) holes from being injected from the pixel electrode 105 into the photoelectric conversion layer 103. Furthermore, in the mode A illustrated in FIG. 13B, the voltage V3, which allows holes to drift from the photoelectric conversion layer 103 toward the pixel electrode 105 according to the applied bias, is assumed to be a voltage for applying such a large bias as to exceed the energy barrier of the first blocking layer 104 to between the upper electrode 101 and the pixel electrode 105. In this case, holes which have moved from the photoelectric conversion layer 103 to the first blocking layer 104 flow in the pixel electrode 105 beyond the energy barrier of the first blocking layer 104. The holes which have flowed in the pixel electrode 105 combine with electrons accumulated in the node B in the photoelectric conversion mode. With this, the electric potential of the node B, which is the first electric charge accumulation portion, is reset to an electric potential obtained before the photoelectric conversion portion 120 enters the photoelectric conversion mode. Accordingly, as in the first exemplary embodiment, the photoelectric conversion device according to the fourth exemplary embodiment also has an effect capable of reducing the circuit area of the pixel 100-4.

Furthermore, since the photoelectric conversion device according to the fourth exemplary embodiment includes the first blocking layer 104, as with the photoelectric conversion device according to the first exemplary embodiment, the photoelectric conversion device according to the fourth exemplary embodiment also has an effect capable of preventing a decrease in contrast of an image, which would occur in a conventional electronic shutter operation.

A photoelectric conversion device according to a fifth exemplary embodiment is described with reference to FIG. 14 mainly about portions different from those in the first exemplary embodiment.

Figure 14:
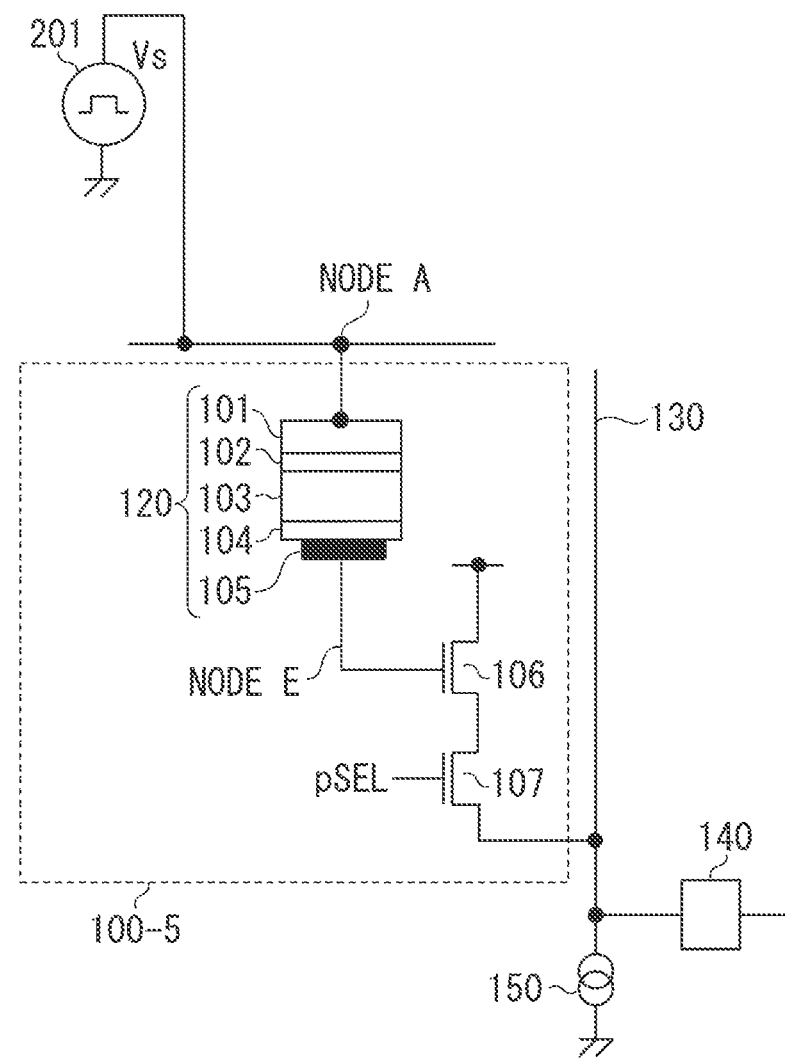
FIG. 14 illustrates a circuit configuration of a pixel.

FIG. 14 illustrates a configuration of a pixel 100-5 included in the photoelectric conversion device according to the fifth exemplary embodiment. In the members illustrated in FIG. 14, members having the same functions as the members illustrated in FIG. 3A are assigned the respective same reference characters as those assigned in FIG. 3A.

The pixel 100-5 has a configuration in which the shutter transistor 111 and the reset transistor 108 are omitted from the configuration of the pixel 100 illustrated in FIG. 3A.

A node E, to which the pixel electrode 105 is connected, is connected to the gate of the amplifying transistor 106. In the fifth exemplary embodiment, the node E is the first electric charge accumulation portion, which retains signal electric charge generated by the photoelectric conversion layer 103.

When the photoelectric conversion portion 120 in the fifth exemplary embodiment operates in the mode A, holes are injected from the photoelectric conversion layer 103 into the pixel electrode 105 via the first blocking layer 104. The holes which have been injected into the pixel electrode 105 reset the electric potential of the node E with electrons serving as signal electric charge accumulated therein. With this, the operation of the photoelectric conversion portion 120 in the mode A enables resetting the electric potential of the first electric charge accumulation portion to which the gate of the amplifying transistor 106 is connected. Therefore, the photoelectric conversion device according to the fifth exemplary embodiment has an effect capable of reducing the circuit area of the pixel 100-5 as much as the reset transistor 108 can be omitted, as compared with the configuration of the pixel 100 in the first exemplary embodiment.

Figure 15:
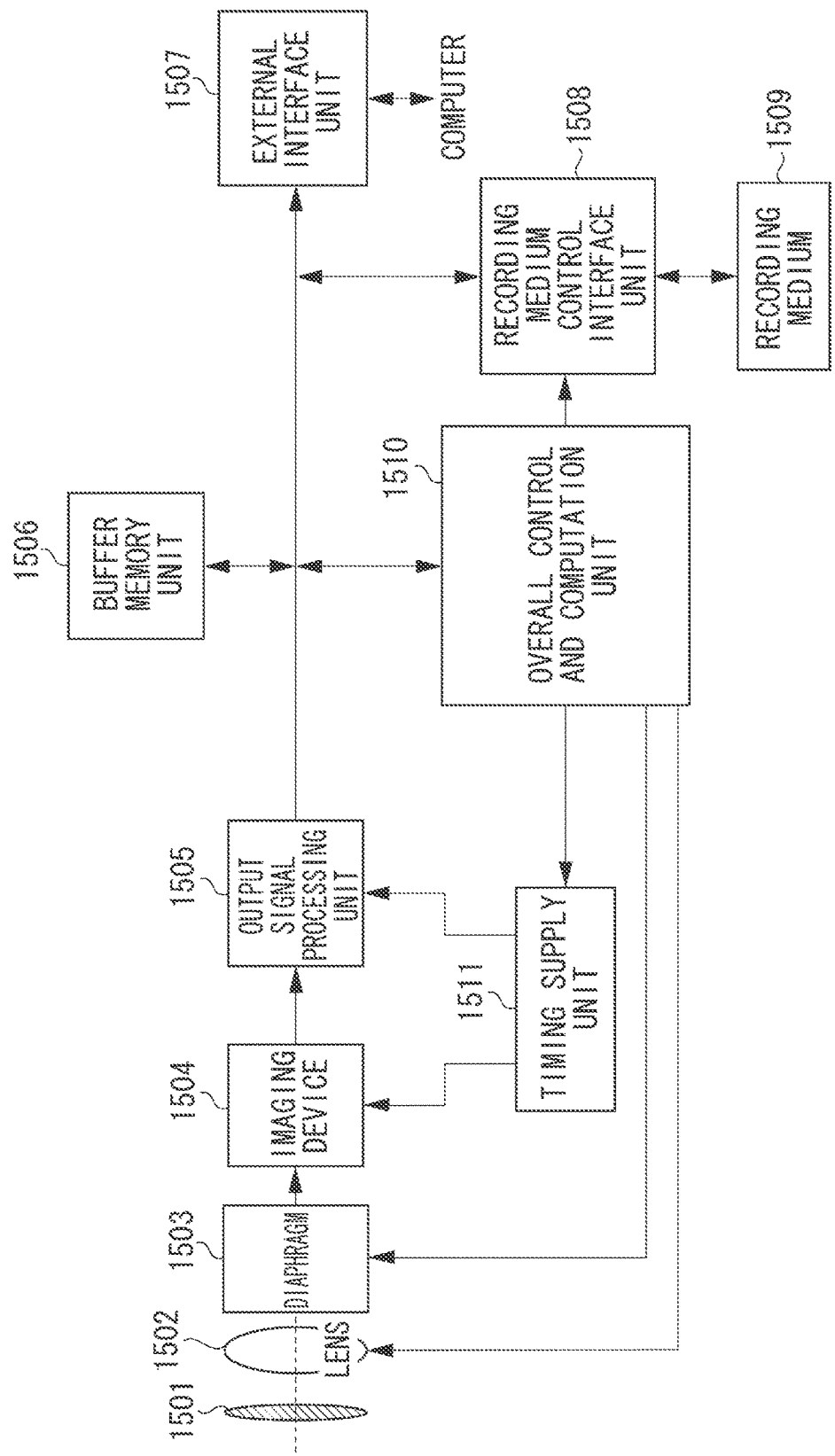
FIG. 15 illustrates a configuration of an imaging system.

An imaging system according to a sixth exemplary embodiment is described. Examples of the imaging system include a digital still camera, a digital camcorder, a camera head, a copying machine, a facsimile machine, a mobile phone, a vehicle-mounted camera, and an observation satellite. FIG. 15 is a block diagram of a digital still camera taken as an example of the imaging system.

The sixth exemplary embodiment is directed to an imaging system including a photoelectric conversion device in any one of the above-described exemplary embodiments as an imaging device 1504.

The imaging system illustrated as an example in FIG. 15 includes a barrier 1501, which is used for lens protection, a lens 1502, which forms an optical image of an object on the imaging device 1504, and a diaphragm 1503, which varies the amount of light passing through the lens 1502. The lens 1502 and the diaphragm 1503 configure an optical system which focuses light on the imaging device 1504. Moreover, the imaging system illustrated as an example in FIG. 15 further includes an output signal processing unit 1505, which performs processing on an output signal output from the imaging device 1504. The output signal processing unit 1505 performs an operation to perform various corrections and compressions as appropriate to output a signal.

The output signal processing unit 1505 performs an operation to generate an image using signals output from the imaging device 1504.

The imaging system illustrated as an example in FIG. 15 further includes a buffer memory unit 1506, which temporarily stores image data, and an external interface unit 1507, which performs communication with, for example, an external computer. The imaging system further includes a removable recording medium 1509, such as a semiconductor memory, which performs recording or reading of captured image data, and a recording medium control interface unit 1508, which performs recording or reading on the recording medium 1509. Moreover, the imaging system further includes an overall control and computation unit 1510, which controls various computations and the entire digital still camera, and a timing supply unit 1511, which outputs various timing signals to the imaging device 1504 and the output signal processing unit 1505. Here, for example, the timing signals can be input from the outside, and the imaging system includes at least the imaging device 1504 and the output signal processing unit 1505, which processes signals output from the imaging device 1504.

The overall control and computation unit 1510 operates as a control unit which adjusts the level of the voltage V2 described in each exemplary embodiment according to a set exposure condition. For example, the overall control and computation unit 1510 sets the level of the voltage V2 in such a manner that the photoelectric conversion portion 120 of the pixel 100 taking an intermediate value in the dynamic range of an image in the set exposure condition enters a flat band state. With this, the imaging device 1504 to which the photoelectric conversion device in each exemplary embodiment is applied is able to adequately perform the mode B according to an exposure condition.

Furthermore, in each pixel 100, a first photoelectric conversion portion 120A and a second photoelectric conversion portion 120B can be provided in pairs with respect to one microlens. The output signal processing unit 1505 processes a signal which is based on electric charge generated by the first photoelectric conversion portion 120A and a signal which is based on electric charge generated by the second photoelectric conversion portion 120B. With this, the imaging system is able to acquire distance information from the imaging device 1504 to an object. Furthermore, many more photoelectric conversion portions can be provided with respect to one microlens. In other words, the output signal processing unit 1505 can acquire distance information from the imaging device 1504 to an object using a signal which is based on electric charge generated by some photoelectric conversion portions of a plurality of photoelectric conversion portions provided in association with one microlens and a signal which is based on electric charge generated by the other photoelectric conversion portions. In this case, the signal which is based on electric charge generated by the other photoelectric conversion portions can be obtained by subtracting the signal which is based on electric charge generated by some photoelectric conversion portions from a signal which is based on the sum of electric charges generated by the plurality of photoelectric conversion portions.

The output signal processing unit 1505 is provided on a second semiconductor substrate different from a first semiconductor substrate on which the imaging device 1504 is formed. The first semiconductor substrate and the second semiconductor substrate can be formed as respective separate chips or can be stacked in layers as a single chip.

Furthermore, an example in which the photoelectric conversion device used as the imaging device 1504 includes the AD conversion portion 204 has been described. As another example, the AD conversion portion 204 can be included in the output signal processing unit 1505. In this case, the imaging device 1504 is configured to output an analog signal to the output signal processing unit 1505.

As described above, the imaging system according to the sixth exemplary embodiment is able to perform an image capturing operation by application of the imaging device 1504.

In this embodiment, the imaging device 1504 and the AD conversion unit are formed in respective separate substrates. However, both of the imaging device 1504 and the AD conversion unit are formed in the same substrate. Furthermore, both the imaging device 1504 and the output signal processing unit 1505 are formed in the same substrate.

Furthermore, each of the above-described exemplary embodiments is merely a specific example taken to implement the disclosure, and should not be construed to limit the technical scope of the disclosure. In other words, the aspects of the embodiments can be implemented in various manners without departing from the technical idea thereof or the principal characteristics thereof. Moreover, some or all of the above-described exemplary embodiments can be combined in various manners to implement the disclosure.

According to exemplary embodiments of the disclosure, techniques capable of optimizing a bias state of a photoelectric conversion layer can be provided.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-233212 filed Nov. 30, 2016, which is hereby incorporated by reference herein in its entirety.

What is claimed is:

1. A photoelectric conversion device comprising a semiconductor substrate and a pixel,
   wherein the pixel includes:
   a first electrode portion;
   a second electrode portion located between the first electrode portion and the semiconductor substrate;
   a photoelectric conversion layer located between the first electrode portion and the second electrode portion and configured to generate signal electric charge; and a voltage supply portion configured to set a reverse bias state and a forward bias state of the photoelectric conversion layer by supplying a plurality of voltages having respective different values to at least one of the first electrode portion and the second electrode portion, wherein the signal electric charge accumulated in the second electrode portion is reset by setting the photoelectric conversion layer to the forward bias state, wherein the voltage supply portion supplies a first voltage to one of the first electrode portion and the second electrode portion in order to set the reverse bias state such that electric charge having a first polarity is injected from the photoelectric conversion layer into the second electrode portion, the electric charge having the first polarity being the signal electric charge, and wherein the voltage supply portion supplies a second voltage to the one of the first electrode portion and the second electrode portion in order to set the forward bias state such that electric charge having a second polarity opposite to the first polarity is injected from the photoelectric conversion layer into the second electrode portion.

2. The photoelectric conversion device according to claim 1,
wherein the pixel further includes a pixel amplifying portion and a switch configured to switch between conduction and non-conduction between the pixel amplifying portion and the second electrode portion, and
wherein, during a period in which the switch is switched to non-conduction, the photoelectric conversion layer is in the forward bias state.

3. The photoelectric conversion device according to claim 1, wherein the voltage supply portion supplies a third voltage to the one of the first electrode portion and the second electrode portion such that both of the electric charge having the first polarity and the electric charge having the second polarity opposite to the first polarity are prevented from being injected from the photoelectric conversion layer into the second electrode portion.

4. The photoelectric conversion device according to claim 3,
wherein the third voltage has a value between the first voltage and the second voltage.

5. An imaging system comprising:
the photoelectric conversion device according to claim 3;
a signal processing unit configured to generate an image by processing a signal output from the photoelectric conversion device; and
a control unit configured to change the third voltage based on a signal level of the signal output from the photoelectric conversion device.

6. The photoelectric conversion device according to claim 1,
wherein the pixel further includes a first electric charge accumulation portion,
wherein the photoelectric conversion layer, when being set to the reverse bias state, outputs signal the electric charge having the first polarity generated therein according to incident light to the first electric charge accumulation portion via the second electrode portion, and
wherein the photoelectric conversion layer, when being set to the forward bias state, outputs the electric charge having the second polarity opposite to the first polarity to the first electric charge accumulation portion via the second electrode portion.

7. The photoelectric conversion device according to claim 6,
wherein the pixel includes a plurality of pixels,
wherein each of the plurality of pixels further includes a transfer portion and a second electric charge accumulation portion,
wherein the transfer portion transfers, to the second electric charge accumulation portion, the signal electric charge output to the first electric charge accumulation portion,
wherein outputting of the signal electric charge from the photoelectric conversion layer to the first electric charge accumulation portion is simultaneously started in the plurality of pixels, and
wherein transfer of the signal electric charge from the first electric charge accumulation portion to the second electric charge accumulation portion is simultaneously ended in the plurality of pixels.

8. The photoelectric conversion device according to claim 7,
wherein each of the plurality of pixels further includes a pixel amplifying portion, and
wherein the pixel amplifying portion outputs a signal which is based on an electric potential of the second electric charge accumulation portion to outside the pixel.

9. The photoelectric conversion device according to claim 1,
wherein the pixel further includes a blocking portion located between the photoelectric conversion layer and the second electrode portion, and
wherein the blocking portion is configured to cause the signal electric charge having the first polarity to be injected from the photoelectric conversion layer into the second electrode portion and to prevent the electric charge having the second polarity opposite to the first polarity from being injected from the photoelectric conversion layer into the second electrode portion.

10. The photoelectric conversion device according to claim 9,
wherein, in a case where, during the forward bias state, an electric potential difference between the first electrode portion and the second electrode portion is less than a predetermined value, the blocking portion prevents the electric charge having the second polarity from being injected from the photoelectric conversion layer into the second electrode portion, and
wherein, in a case where, during the forward bias state, an electric potential difference between the first electrode portion and the second electrode portion is greater than the predetermined value, the blocking portion causes the electric charge having the second polarity to be injected from the photoelectric conversion layer into the second electrode portion.

11. The photoelectric conversion device according to claim 9, wherein an energy band of the blocking portion is lower in potential with respect to the electric charge having the first polarity and higher in potential with respect to the electric charge having the second polarity than an energy band of the photoelectric conversion layer.

12. The photoelectric conversion device according to claim 9, wherein the pixel further includes a second blocking portion located between the photoelectric conversion layer and the first electrode portion and configured to prevent electric charge having the first polarity from being injected from the first electrode portion into the photoelectric conversion layer.

13. The photoelectric conversion device according to claim 9, wherein principal elements respectively used to form the blocking portion and the photoelectric conversion layer are equal.

14. The photoelectric conversion device according to claim 13, wherein respective impurity concentrations of the blocking portion and the photoelectric conversion layer are different from each other.

15. The photoelectric conversion device according to claim 13, wherein respective conductivity types of the blocking portion and the photoelectric conversion layer are different from each other.

16. The photoelectric conversion device according to claim 9,
wherein the blocking portion is formed of a first semiconductor material, and
wherein the photoelectric conversion layer is formed of a second semiconductor material which principally contains an element different from a principal element used to form the first semiconductor material.

17. The photoelectric conversion device according to claim 16, wherein the blocking portion and the photoelectric conversion layer form a heterojunction.

18. An imaging system comprising:
the photoelectric conversion device according to claim 1; and
a signal processing unit configured to generate an image by processing a signal output from the photoelectric conversion device.

19. The imaging system according to claim 18, wherein a semiconductor substrate on which the photoelectric conversion device is provided and a semiconductor substrate on which the signal processing unit is provided are stacked in layers.

20. The imaging system according to claim 18,
wherein the pixel includes a plurality of photoelectric conversion portions, each including the first electrode portion, the second electrode portion, and the photoelectric conversion layer, and one microlens provided in association with the plurality of photoelectric conversion portions, and
wherein the signal processing unit acquires distance information about an object using a signal which is based on electric charge having a first polarity output from some photoelectric conversion portions of the plurality of photoelectric conversion portions and a signal which is based on electric charge having the first polarity output from the other photoelectric conversion portions of the plurality of photoelectric conversion portions.

21. A photoelectric conversion device comprising a semiconductor substrate and a pixel,
wherein the pixel includes:
a first electrode portion;
a second electrode portion located between the first electrode portion and the semiconductor substrate;
a photoelectric conversion layer located between the first electrode portion and the second electrode portion and configured to generate signal electric charge; and
a voltage supply portion configured to set a reverse bias state and a forward bias state of the photoelectric conversion layer by supplying a plurality of voltages having respective different values to at least one of the first electrode portion and the second electrode portion,
wherein the signal electric charge accumulated in the second electrode portion is reset by setting the photoelectric conversion layer to the forward bias state,
wherein the pixel further includes a blocking portion located between the photoelectric conversion layer and the second electrode portion,
wherein the blocking portion is configured to cause signal electric charge having a first polarity to be injected from the photoelectric conversion layer into the second electrode portion and to prevent electric charge having a second polarity opposite to the first polarity from being injected from the photoelectric conversion layer into the second electrode portion,
wherein, in a case where, during the forward bias state, an electric potential difference between the first electrode portion and the second electrode portion is less than a predetermined value, the blocking portion prevents the electric charge having the second polarity from being injected from the photoelectric conversion layer into the second electrode portion, and
wherein, in a case where, during the forward bias state, an electric potential difference between the first electrode portion and the second electrode portion is greater than the predetermined value, the blocking portion causes the electric charge having the second polarity to be injected from the photoelectric conversion layer into the second electrode portion.

22. The photoelectric conversion device according to claim 21,
wherein the pixel further includes a pixel amplifying portion and a switch configured to switch between conduction and non-conduction between the pixel amplifying portion and the second electrode portion, and
wherein, during a period in which the switch is switched to non-conduction, the photoelectric conversion layer is in the forward bias state.

23. The photoelectric conversion device according to claim 21, wherein the voltage supply portion supplies a third voltage to the one of the first electrode portion and the second electrode portion such that both of the electric charge having the first polarity and the electric charge having the second polarity opposite to the first polarity are prevented from being injected from the photoelectric conversion layer into the second electrode portion.

24. An imaging system comprising:
the photoelectric conversion device according to claim 23;
a signal processing unit configured to generate an image by processing a signal output from the photoelectric conversion device; and
a control unit configured to change the third voltage based on a signal level of the signal output from the photoelectric conversion device.

25. The photoelectric conversion device according to claim 21,
wherein the pixel further includes a first electric charge accumulation portion,
wherein the photoelectric conversion layer, when being set to the reverse bias state, outputs signal the electric charge having the first polarity generated therein according to incident light to the first electric charge accumulation portion via the second electrode portion, and wherein the photoelectric conversion layer, when being set to the forward bias state, outputs the electric charge having the second polarity opposite to the first polarity to the first electric charge accumulation portion via the second electrode portion.

26. The photoelectric conversion device according to claim 25,
wherein the pixel includes a plurality of pixels,
wherein each of the plurality of pixels further includes a transfer portion and a second electric charge accumulation portion,
wherein the transfer portion transfers, to the second electric charge accumulation portion, the signal electric charge output to the first electric charge accumulation portion,
wherein outputting of the signal electric charge from the photoelectric conversion layer to the first electric charge accumulation portion is simultaneously started in the plurality of pixels, and
wherein transfer of the signal electric charge from the first electric charge accumulation portion to the second electric charge accumulation portion is simultaneously ended in the plurality of pixels.

27. The photoelectric conversion device according to claim 26,
wherein each of the plurality of pixels further includes a pixel amplifying portion, and
wherein the pixel amplifying portion outputs a signal which is based on an electric potential of the second electric charge accumulation portion to outside the pixel.

28. The photoelectric conversion device according to claim 21, wherein an energy band of the blocking portion is lower in potential with respect to the electric charge having the first polarity and higher in potential with respect to the electric charge having the second polarity than an energy band of the photoelectric conversion layer.

29. The photoelectric conversion device according to claim 21, wherein the pixel further includes a second blocking portion located between the photoelectric conversion layer and the first electrode portion and configured to prevent electric charge having the first polarity from being injected from the first electrode portion into the photoelectric conversion layer.

30. The photoelectric conversion device according to claim 21, wherein principal elements respectively used to form the blocking portion and the photoelectric conversion layer are equal.

31. The photoelectric conversion device according to claim 30, wherein respective impurity concentrations of the blocking portion and the photoelectric conversion layer are different from each other.

32. The photoelectric conversion device according to claim 30, wherein respective conductivity types of the blocking portion and the photoelectric conversion layer are different from each other.

33. The photoelectric conversion device according to claim 21,
wherein the blocking portion is formed of a first semiconductor material, and
wherein the photoelectric conversion layer is formed of a second semiconductor material which principally contains an element different from a principal element used to form the first semiconductor material.

34. The photoelectric conversion device according to claim 33, wherein the blocking portion and the photoelectric conversion layer form a heterojunction.

35. An imaging system comprising:
the photoelectric conversion device according to claim 21; and
a signal processing unit configured to generate an image by processing a signal output from the photoelectric conversion device.

36. The imaging system according to claim 35, wherein a semiconductor substrate on which the photoelectric conversion device is provided and a semiconductor substrate on which the signal processing unit is provided are stacked in layers.

37. The imaging system according to claim 35,
wherein the pixel includes a plurality of photoelectric conversion portions, each including the first electrode portion, the second electrode portion, and the photoelectric conversion layer, and one microlens provided in association with the plurality of photoelectric conversion portions, and
wherein the signal processing unit acquires distance information about an object using a signal which is based on electric charge having a first polarity output from some photoelectric conversion portions of the plurality of photoelectric conversion portions and a signal which is based on electric charge having the first polarity output from the other photoelectric conversion portions of the plurality of photoelectric conversion portions.

* * * * *